(12) United States Patent
Konishi et al.

(10) Patent No.: US 10,359,181 B2
(45) Date of Patent: Jul. 23, 2019

(54) SUBSTRATE FOR LIGHT EMITTING DEVICE AND MANUFACTURING METHOD OF SUBSTRATE FOR LIGHT EMITTING DEVICE

(71) Applicant: Sharp Kabushiki Kaisha, Sakai, Osaka (JP)

(72) Inventors: Masahiro Konishi, Sakai (JP); Shin Itoh, Sakai (JP); Hiroshi Yamashita, Sakai (JP); Ippei Yamaguchi, Sakai (JP); Hiroyuki Nokubo, Sakai (JP); Yoshiaki Itakura, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 115 days.

(21) Appl. No.: 15/533,080

(22) PCT Filed: Oct. 20, 2015

(86) PCT No.: PCT/JP2015/079570
§ 371 (c)(1),
(2) Date: Jun. 5, 2017

(87) PCT Pub. No.: WO2016/092956
PCT Pub. Date: Jun. 16, 2016

(65) Prior Publication Data
US 2017/0328545 A1 Nov. 16, 2017

(30) Foreign Application Priority Data
Dec. 8, 2014 (JP) .................................. 2014-248318

(51) Int. Cl.
| | |
|---|---|
| F21V 21/002 | (2006.01) |
| H01L 33/60 | (2010.01) |
| H01L 33/62 | (2010.01) |
| F21V 7/10 | (2006.01) |
| F21V 23/06 | (2006.01) |
| H01L 33/64 | (2010.01) |
| F21V 29/74 | (2015.01) |

(Continued)

(52) U.S. Cl.
CPC .............. *F21V 21/002* (2013.01); *F21V 7/10* (2013.01); *F21V 23/06* (2013.01); *H01L 33/60* (2013.01);
(Continued)

(58) Field of Classification Search
CPC ..... F21V 21/002; H01L 33/60; F21Y 2115/10
(Continued)

(56) References Cited

U.S. PATENT DOCUMENTS

| | | |
|---|---|---|
| 2012/0074445 A1 | 3/2012 | Shimonishi et al. |
| 2012/0132952 A1* | 5/2012 | Yen ........................ H01L 33/647 257/99 |

(Continued)

FOREIGN PATENT DOCUMENTS

| | | |
|---|---|---|
| JP | 2011-096743 A | 5/2011 |
| JP | 2011-151295 A | 8/2011 |

(Continued)

OTHER PUBLICATIONS

Official Communication issued in International Patent Application No. PCT/JP2015/079570, dated Dec. 1, 2015.

*Primary Examiner* — Sherman Ng
(74) *Attorney, Agent, or Firm* — Keating & Bennett, LLP

(57) ABSTRACT

An electrode pattern (13) formed on a ceramics layer (2) in a substrate for a light emitting device (circuit board (320)) of the present invention includes a first metal layer (5), a second metal layer (7), and an electrode terminal unit (10), and the thickness of a part at which the electrode terminal unit (10) is not formed in the electrode pattern (13) is at least equal to or greater than 35 μm. Accordingly, it is possible to suppress heat resistance to be low.

30 Claims, 18 Drawing Sheets

1: METAL BASE (ALUMINUM)
2: CERAMICS LAYER (ALUMINA)
5: FIRST METAL LAYER (ELECTROLESS COPPER PLATING LAYER)
7: SECOND METAL LAYER (ELECTROLYTIC COPPER PLATING LAYER)
10: ELECTRODE TERMINAL UNIT (ELECTROLYTIC COPPER PLATING LAYER)
11: LIGHT REFLECTION LAYER
12: LIGHT EMITTING ELEMENT
320: CIRCUIT BOARD

(51) Int. Cl.
*F21Y 105/10* (2016.01)
*F21Y 115/10* (2016.01)

(52) U.S. Cl.
CPC ............ H01L 33/62 (2013.01); H01L 33/644 (2013.01); *F21V 29/74* (2015.01); *F21Y 2105/10* (2016.08); *F21Y 2115/10* (2016.08); *H01L 2224/16* (2013.01); *H01L 2224/16225* (2013.01); *H01L 2924/0002* (2013.01)

(58) Field of Classification Search
USPC ....................................................... 174/260
See application file for complete search history.

(56) References Cited

U.S. PATENT DOCUMENTS

| | | | | |
|---|---|---|---|---|
| 2013/0092421 A1* | 4/2013 | Kajiya | ................. | H05K 1/0206 174/252 |
| 2013/0187190 A1* | 7/2013 | Muramatsu | .......... | H05K 1/0201 257/99 |
| 2013/0208026 A1* | 8/2013 | Suzuki | .................... | H01L 33/36 345/690 |
| 2014/0264417 A1* | 9/2014 | Kobayashi | .............. | H01L 33/60 257/98 |
| 2015/0200337 A1* | 7/2015 | Denda | .................... | H05K 1/115 257/99 |
| 2015/0316242 A1 | 11/2015 | Konishi et al. | | |

FOREIGN PATENT DOCUMENTS

| | | |
|---|---|---|
| JP | 2011-176189 A | 9/2011 |
| JP | 2012-074483 A | 4/2012 |
| JP | 2012-186327 A | 9/2012 |
| JP | 2012-212788 A | 11/2012 |
| JP | 2013-093459 A | 5/2013 |
| JP | 2013-102046 A | 5/2013 |
| JP | 2014-036162 A | 2/2014 |
| WO | 2014/122971 A1 | 8/2014 |

\* cited by examiner

1: METAL BASE (ALUMINUM)
2: CERAMICS LAYER (ALUMINA)
5: FIRST METAL LAYER (ELECTROLESS COPPER PLATING LAYER)
7: SECOND METAL LAYER (ELECTROLYTIC COPPER PLATING LAYER)
10: ELECTRODE TERMINAL UNIT (ELECTROLYTIC COPPER PLATING LAYER)
11: LIGHT REFLECTION LAYER
12: LIGHT EMITTING ELEMENT
320: CIRCUIT BOARD

1: METAL BASE (ALUMINUM)
2: CERAMICS LAYER (FIRST ELECTRICAL INSULATION LAYER)
10: ELECTRODE TERMINAL UNIT (ELECTROLYTIC COPPER PLATING LAYER)
11: LIGHT REFLECTION LAYER (SECOND ELECTRICAL INSULATION LAYER)
12: LIGHT EMITTING ELEMENT
13: ELECTRODE PATTERN
15: FLAT LAYER (GLASS LAYER CONTAINING ALUMINA)
320B: CIRCUIT BOARD

301: LIGHT EMITTING DEVICE
302: METAL BASE (ALUMINUM)
303: ELECTRODE PATTERN
304: LIGHT EMITTING ELEMENT
305: LIGHT REFLECTION RESIN FRAME
306: SEALING RESIN CONTAINING PHOSPHOR
307: ANODE ELECTRODE
308: CATHODE ELECTRODE
309: ANODE MARK
310: CATHODE MARK

301: LIGHT EMITTING DEVICE
302: METAL BASE
303: ELECTRODE PATTERN
304: LIGHT EMITTING ELEMENT
305: LIGHT REFLECTION RESIN FRAME
306: SEALING RESIN CONTAINING PHOSPHOR
307: ANODE ELECTRODE
308: CATHODE ELECTRODE
311: INTERMEDIATE LAYER (FIRST ELECTRICAL INSULATION LAYER)
312: REFLECTION LAYER (SECOND ELECTRICAL INSULATION LAYER)
315: REAR SURFACE ELECTRODE
320C: CIRCUIT BOARD

SUBSTRATE FOR LIGHT EMITTING DEVICE AND MANUFACTURING METHOD OF SUBSTRATE FOR LIGHT EMITTING DEVICE

TECHNICAL FIELD

The present invention relates to a substrate for a light emitting device on which a ceramics layer and an electrode pattern are formed on a metal base, particularly, a substrate structure of a substrate for a light emitting device which is used in an illumination device and directly has a light emitting element loaded on the electrode pattern, a light emitting device which uses the substrate for a light emitting device, an illumination device, and a manufacturing method of the substrate for a light emitting device.

BACKGROUND ART

In a case where an electrode pattern is formed on an insulating substrate, for example, on a print substrate, the electrode pattern is generally formed by etching after pasting a copper foil to a base via an adhesive layer. In addition, on a ceramics substrate, the electrode pattern is generally formed by electrolytic plating after printing a conductive pattern that becomes a ground of the electrode by a conductive paste.

Furthermore, a method of forming an electrode pattern by forming a thin film of metal having a high melting point, such as Ni, Ti, Co, or Cr, by a sputtering method, on the substrate, by further forming a thin copper film by a sputtering method, and then, on seed metal using the metal thin film as seed metal, by forming a thick film of Cu by electrolytic plating, on the substrate on which an alumite layer is formed as an insulation layer on an aluminum base, is disclosed, for example, in PTL 1 and PTL 2.

CITATION LIST

Patent Literature

PTL 1: Japanese Unexamined Patent Application Publication No. 2011-96743 (filed on May 12, 2011)
PTL 2: Japanese Unexamined Patent Application Publication No. 2013-102046 (filed on May 23, 2013)

SUMMARY OF INVENTION

Technical Problem

However, on the substrate on which the ceramics layer and the electrode pattern are formed on the metal base, and which is used in the illumination device to have the light emitting element directly loaded onto the electrode pattern, a path from the light emitting element to a heat sink via the electrode pattern, the ceramics layer, and the metal base is a main heat radiating path. On the substrate, when forming the electrode pattern in the technology of the related art, a layer having low thermal conductivity of an adhesive or a conductive paste is interposed between the ceramics layer and the electrode pattern. In other words, since a part at which the electrode pattern is formed exists in the vicinity of the light emitting element on the main heat radiating path, there is a problem that a contribution ratio to a substrate heat resistance is high and the heat resistance of the entire substrate is high. As a result, a problem that the temperature of the light emitting element or a solder joining unit which is used for connecting the light emitting element to the electrode terminal is high, is generated.

In a case of using the substrate on which the problem is generated in a high-brightness light emitting device, since the temperature in a practical use environment of lightning appliance is high, a high or low degree of thermal conductivity in the vicinity of the light emitting element or a quality of heat radiation directly influences a life span of the light emitting device.

In addition, in a case of forming the alumite layer on the aluminum base and using the alumite layer as an insulation layer, when passing through a manufacturing process at a high temperature, for example, a temperature that exceeds 200° C., cracks are generated in the aluminte layer, and thus, insulation pressure resistance deteriorates and a function as the insulation layer is not achieved. In a case of mounting the light emitting element on the electrode pattern by using a stable AuSn eutectic solder which is widely used in a flip-chip type light emitting element even when the temperature of the solder joining unit is high, it is necessary to pass through a furnace in which the temperature is high in a reflow process, and the substrate temperature exceeds 300° C. Therefore, the substrate that uses alumite obtained by an anodic oxidation method as the insulation layer, is not appropriate for mounting the flip-chip type light emitting element.

The alumite obtained by the anodic oxidation method is generally thin to be 10 μm or less and tens of μm or less even when the alumite is thick, and it is difficult to ensure high electrical insulation pressure resistance performance which is necessary in high-brightness illumination substrate, for example, resistance voltage which exceeds 4 kV.

In addition, in a case of forming the electrode pattern by copper directly on the alumite, adhesion of copper and alumite becomes low and the adhesion of alumite and copper which are particularly sealed becomes low. Since the alumite itself does not function as the insulation layer, the sealing treatment is essential in using the alumite as the insulation layer, but the electrode pattern of copper formed on the insulation layer is likely to be inevitably peeled.

Originally, the alumite is a porous film, and thus, when forming the electrode pattern directly on the alumite layer, the aluminum of the base and the electrode pattern electrically come into contact with each other and conducted to each other. In order to avoid a short circuit with the metal base, after a pore of the alumite layer is blocked by the sealing treatment, it is necessary to form the electrode pattern. As a result of blocking the pore of the sealed alumite, flatness increases, an anchor effect cannot be expected due to an uneven surface with respect to the electrode pattern formed thereon, and the electrode pattern is easily peeled.

For example, in PTL 2 or the like, in order to ensure the adhesion of copper and alumite, a thin film of metal having a high melting point, such as Ni, Ti, Co, and Cr, is inserted by the sputtering method. It is considered that this is a film in which a layer of Ni, Ti, Co, and Cr formed by the sputtering forms alumite and metalized layer, and an adhesion strength of copper and alumite is improved by being interposed between copper and alumite.

However, the sputtering is a process that requires a vacuum device, a tact is low, and in manufacturing a large substrate for high-brightness illumination, this mainly causes an increase in costs. In the substrate for high-brightness illumination in which it is necessary to integrate and load a plurality, such as 5 or 10, and especially 100 or more, of light emitting elements, an area of the electrode pattern increases, and thus, a substrate dimension of each one of the substrates increases, the number of substrates which can be inevitably treated by one tact decreases, and the production becomes inefficient.

Furthermore, when considering a use efficiency of a metal target which is an original material for the sputtering, and further, a practical target use efficiency considering a proportion of being practically uptaken as a film during film formation, the costs of the electrode forming in which the sputtering is used increases in manufacturing a light emitting element integration type substrate for high-brightness illumination or a large substrate, and thus, the electrode forming is not appropriate for commercial production for this use.

Considering the above-described problems, an object of the present invention is to provide a substrate for a light emitting device which can suppress heat resistance as the entire substrate for a light emitting device to be low by forming a thick electrode pattern on a thick ceramics layer having excellent electrical insulation pressure resistance on a metal base.

Solution to Problem

In order to solve the above-described problems, according to an aspect of the present invention, there is provided a substrate for a light emitting device including: a metal base; a highly thermally conductive first electrical insulation layer formed on the metal base; and an electrode pattern formed on the first electrical insulation layer, in which the electrode pattern includes a ground layer configured of a first metal layer formed on the first electrical insulation layer, a wiring unit configured of a second metal layer formed on the ground layer, and an electrode terminal unit formed on the wiring unit, and in which the thickness of a part at which the electrode terminal unit is not formed in the electrode pattern is at least equal to or greater than 35 μm (set in accordance with heat resistance of the first electrical insulation layer).

Advantageous Effects of Invention

According to one aspect of the present invention, an effect that it is possible to suppress the heat resistance of the entire substrate for a light emitting device to be low is achieved.

DESCRIPTION OF EMBODIMENTS

[Embodiment 1]

Figure 1:
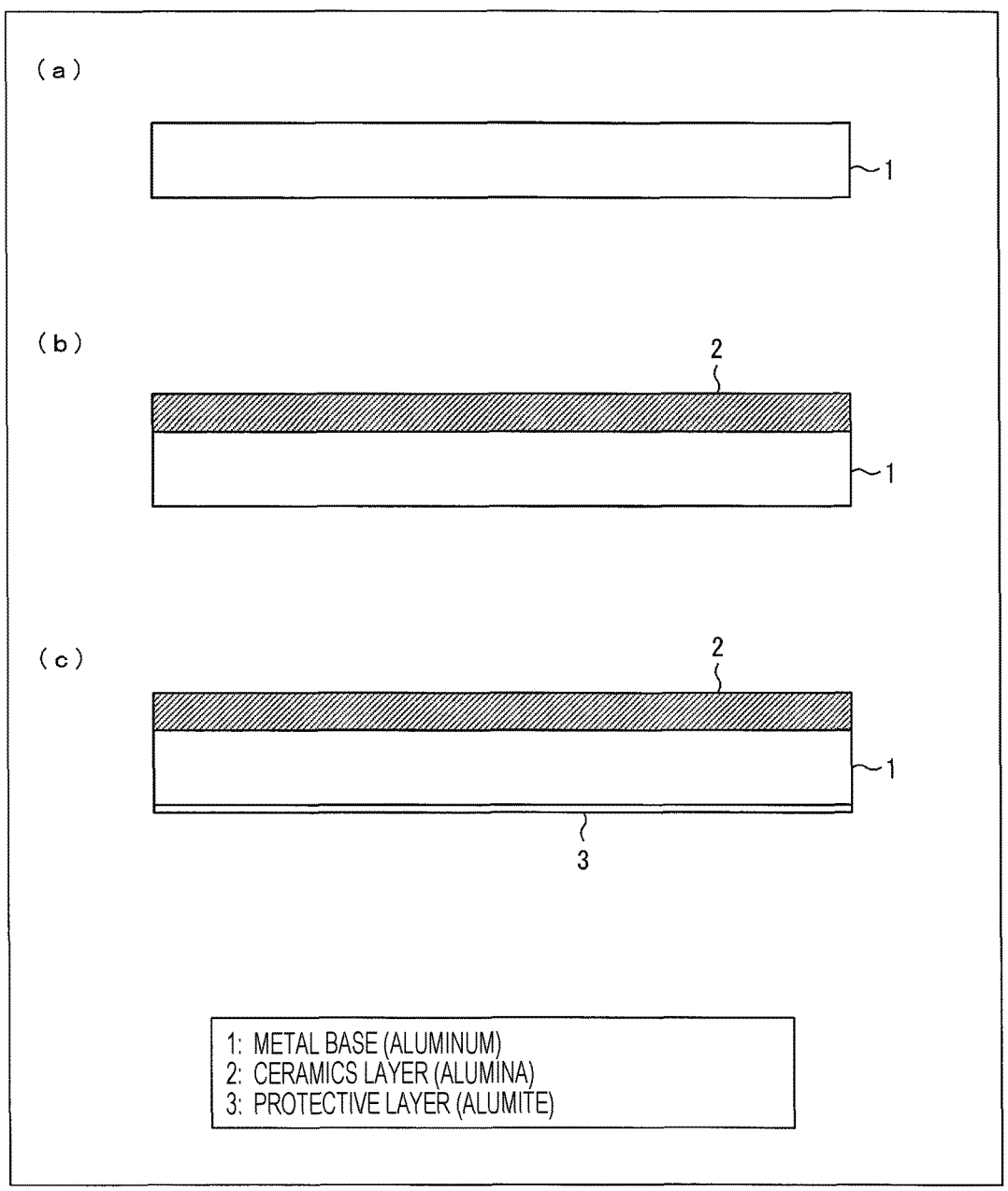
FIG. 1 is a view illustrating a manufacturing process of a light emitting device according to Embodiment 1 of the present invention.

Hereinafter, an embodiment of the present invention will be described in detail.

FIGS. 1 to 5 are views illustrating a manufacturing process of a light emitting device 301 according to the embodiment.

As illustrated in FIG. 5(b), the light emitting device according to the embodiment is configured to include a light emitting element 12 which is connected to an electrode terminal unit 10 of an electrode pattern formed on a ceramics layer 2, in a circuit board (substrate for a light emitting device) 320 on which a metal base 1 made of aluminum and the ceramics layer (first electrical insulation layer) 2 made of alumina are laminated. The electrode pattern includes a relatively thin first metal layer 5 (ground layer) formed on the ceramics layer 2, a second metal layer 7 which is thicker than the first metal layer 5 and is formed on the first metal layer 5, and a silver layer 8 formed on the second metal layer 7, and is configured to include the electrode terminal unit 10 formed on the silver layer 8. Here, a wiring unit has a multilayered structure in which the second metal layer 7 is made of a copper layer and the silver layer 8 is laminated on the copper layer.

In particular, the thickness of a part at which the electrode terminal unit 10 is not formed in the electrode pattern, that is, the total thickness of the first metal layer 5 and the second metal layer 7, is set in accordance with the heat resistance of the ceramics layer 2. This will be described later in detail.

Hereinafter, manufacturing of the light emitting device according to the embodiment will be described.

<Electrode Forming Method 1>

(Preparation of Ground of Insulation Substrate Which Uses Metal Base)

First, as illustrated in FIG. 1(a), the metal base 1 is prepared. Next, as illustrated in FIG. 1(b), the ceramics layer 2 is formed on the metal base 1.

As the metal base 1, metal which has high thermal conductivity and high heat radiation, such as aluminum or copper, is particularly preferable. In addition, as the metal base 1, a stainless base or a base made of metal including iron as a material may be employed. In this case, it is possible to make the base thin since mechanical strength is high, and as a result, it is possible to ensure high heat radiation. Therefore, the stainless base or the base made of iron is still preferable as a high heat radiation base. Here, aluminum having a light weight and excellent workability is used.

As the ceramics layer 2, an arbitrary inorganic solid substance having excellent heat radiation, electrical insulation, and heat resisting properties may be employed, but alumina which is widely used is the most preferable since alumina has high reliability with respect to a quality of material and excellent mass productivity. It is possible to realize insulation pressure resistance which is generally equal to or greater than 4.5 kV at the thickness of 200 μm to 300 μm.

In general, since the thickness of alumite formed by performing anodic oxidation treatment with respect to an aluminum substrate is 10 μm and 50 μm even when the alumite is thick, it is difficult to realize the insulation pressure resistance that exceeds 1 kV after performing sealing treatment. In addition, by an AuSn eutectic solder having high reliability at a high temperature, in a case of joining a light emitting element to a substrate terminal to each other, high temperature heat treatment in which a substrate temperature exceeds 300° C. is necessary, but in the high temperature treatment, cracks are generated in the alumite layer and the insulation pressure resistance substantially deteriorates.

Therefore, in the present invention, not an alumite layer which has the above-described defects and is formed by using an anodic oxidation method, but a thick-filmed ceramics layer having excellent insulation pressure resistance is used. As a method of forming the thick-filmed ceramics layer, a method of injecting ceramics particles toward the base at a high speed and depositing the ceramics particles, such as thermal spraying or an AD method (aerosol deposition method), is preferable for making it possible to efficiently form the ceramics layer. In the AD method, the ceramics particles are accelerated due to a pressure difference, and thus, a vacuum device is necessary, but since the acceleration of ceramics fine particles is a goal, unlike the sputtering, the quality of vacuum is not required, and it is sufficient if the minimum decompression necessary for acceleration is ensured. Therefore, the vacuum device is different from a vacuum device in the sputtering method used in forming an electrode or the like, and the vacuum device used in the AD method does not regulate productivity.

In this manner, when forming the ceramics layer, in order to improve adhesion of the metal base and the ceramics layer, it is preferable to perform blast treatment with respect to the base surface in advance, and is more preferable to insert a buffer layer for reducing a difference in linear expansion coefficients of the metal base and the ceramics layer. In a case of using aluminum as the metal base and alumina as the ceramics layer, an alloy of nickel and aluminum may be used as the buffer layer.

As another method of forming the ceramics layer, a mixed layer of ceramics particles and resin may be formed by firing after coating the metal base with paint including ceramics particles using a resin as a binder, or a mixed layer of the ceramics particles and glass may be formed by firing after coating the metal base with paint obtained by mixing a glass original material and ceramics particles into each other.

Next, as illustrated in FIG. 1(c), a protective layer 3d is formed on side opposite to the ceramics layer 2 of the metal base 1. As the protective layer 3, a protective sheet may be pasted, but in a case of using aluminum as the metal base 1, it is simple to form the alumite layer by the anodic oxidation treatment, and it is possible to use the alumite layer as a stable protective film while maintaining the state thereof even after finishing the manufacturing process. A through pore which is generated on the layer and reaches the metal base 1 from a surface is closed when the sealing treatment is performed by hot water or the like, and the alumite layer becomes stabler protective layer.

The preparation of the ground of the insulation substrate which uses aluminum as the metal base 1 is completed in the above-described order.

(Electrode Forming: First Method)

Here, a method of forming an electrode layer on the ground of the insulation substrate prepared in the above-described order will be described.

First, as illustrated in FIG. 2(b), a thin first metal layer 5 is formed on the ceramics layer 2. Since the ceramics layer 2 is formed of an electrical insulation material, an electrical conductive layer cannot be formed directly on the ceramics layer 2 by an electrolytic plating method. Therefore, as illustrated in FIG. 2(a), the surface of the ceramics layer 2 is covered with a catalyst layer 4 in advance. For example, it is possible to replace the ceramics layer 2 covered with a palladium catalyst as the catalyst layer 4 with a thin electroless plating layer of copper by an electroless plating method, and in this manner, the first metal layer 5 is formed on the ceramics layer 2 and an electrical conductive layer is achieved. The thickness of the first metal layer 5 may be generally equal to or less than 1 μm, and may be an extremely thin layer which is equal to or less than 0.1 μm. The thin first metal layer 5 prepared in this manner is made of an alloy of copper and palladium of which a part of palladium used in catalyst is uptaken into copper. It is possible to laminate the metal using the electrolytic plating method on the first metal layer 5 to be thick.

Here, on the surface of the ceramics layer 2 formed by thermal spraying, for example, since there are an uneven shape having a depth of approximately 5 μm to 20 μm, or further, fine pores, an anchor effect with respect to the first metal layer 5 is obtained, and the two layers (the ceramics layer 2 and the first metal layer 5) realize excellent adhesion.

In addition, in a case of the ceramics layer 2 formed by the AD method, a ceramics layer which is more accurate has more excellent flatness than that formed by thermal spraying is achieved. Therefore, in order to improve the adhesion of the ceramics layer 2 and the first metal layer 5, the first metal layer 5 may be formed after intentionally forming an uneven shape on the surface by lightly performing the blast treatment with respect to the surface of the ceramics layer 2. The film thickness of the ceramics layer 2 is made thick to be 200 to 300 μm in the embodiment for improving the insulation pressure resistance. Therefore, even when the surface of the ceramics layer 2 is lightly blast-treated, a failure, such as peeling of the ceramics layer 2 by a shock or deterioration of insulation pressure resistance similar to the problems in practical use, is not generated.

In this manner, even when the first metal layer 5 of copper is formed directly by the electroless plating by using the palladium catalyst as the catalyst layer 4 on the ceramics layer 2 in the present invention, and even when the thick second metal layer 7 (FIG. 3) is formed using the thin first metal layer 5 as the seed metal, it is possible to ensure sufficient adhesion between the ceramics layer 2 and the first metal layer 5.

However, this does not interrupt to use metal having a high melting point, such as Ni, Ti, Co, and Cr as a part of the seed metal configured of the first metal layer 5 in order to improve the adhesion of the ceramics layer 2 and the first metal layer 5. For example, after forming a thin layer of nickel by using the catalyst, a thin layer of copper may also be formed by using the catalyst and may be considered as the first metal layer 5.

However, unlike copper which can be easily removed by ferric chloride, in order to remove Ni, Ti, Co, and Cr, it is necessary to use a strong acid, such as hydrofluoric acid or dilute nitric acid that performs oxidation. Therefore, as the first metal layer 5, when using metal, such as Ni, Ti, Co, and Cr, in addition to copper, the number of additional manufacturing processes increases in etching treatment, and further, explosion-proof equipment for using the hydrofluoric acid is additionally necessary.

Meanwhile, in a case of forming the first metal layer 5 of copper directly by the electroless plating using the palladium catalyst as the catalyst layer 4 on the ceramics layer 2, and forming the thick second metal layer 7 (FIG. 3) using the thin first metal layer 5 as the seed metal, the seed metal configured of the first metal layer 5 can be easily electrically cut by using the ferric chloride, and can be finished as the electrode pattern. In addition to this, the adhesion of the electrode pattern and the ceramics layer 2 also sufficiently achieved. Therefore, it is preferable to use only copper in the first metal layer 5.

Finally, in order to remove residues of the palladium catalyst, immersion into a cyanogen-based compound, for example, potassium cyanide solution, may be employed. The cyanogen-based compound is also a toxic substance, but can be used as a general material in the plating treatment process.

Figure 2:
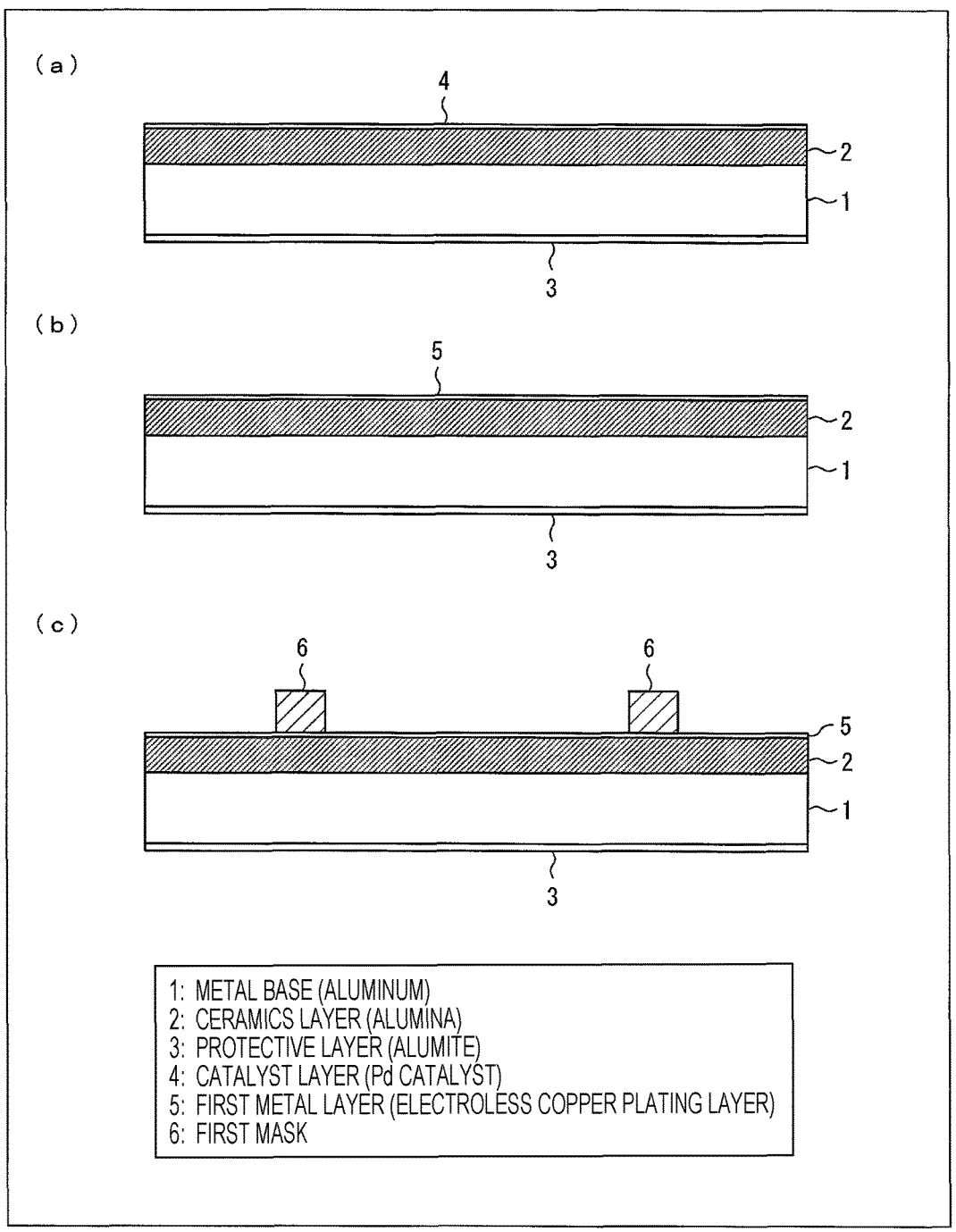
FIG. 2 is a view illustrating a manufacturing process of a circuit board according to Embodiment 1 of the present invention.

In forming the electrode pattern on the first metal layer 5 prepared in this manner, it is desirable to repeat forming of a mask having an opening unit that corresponds to the necessary electrode pattern and the electrolytic plating treatment (FIGS. 2(*c*) to 4(*c*)).

The maximum thickness of the electrode pattern which also includes a terminal part in the embodiment exceeds 50 μm to 100 μm. It is ascertained that the electrode pattern is relatively thick when being compared with a general electrode pattern that does not even satisfy 10 μm. The electrode pattern is made thick because it is possible to lower heat resistance of the substrate by increasing the thickness of the electrode pattern and widely taking the electrode area in a case of loading a flip-chip type light emitting element on the electrode pattern on the substrate that has the insulation pressure resistance by forming the ceramics layer on the metal base. This is an effect that can be obtained as the heat generated by the light emitting element also diffuses in a horizontal direction while passing through the electrode pattern in a substrate vertical direction, and sufficiently spreads in the horizontal direction until reaching the ceramics layer having lower thermal conductivity than that of the electrode pattern.

In a case of forming the thick electrode in this manner, when forming the electrode pattern by the following method disclosed in the embodiment, a minimum amount of metal necessary for forming the electrode may be deposited, and thus, it is possible to efficiently use the electrode material, and the loss can be small.

The electrical insulation mask is used as the mask to be used in mask forming. A photomask may be formed by using a photoresist, or a mask may be formed by using an insulating adhesive sheet (dry film).

Figure 3:
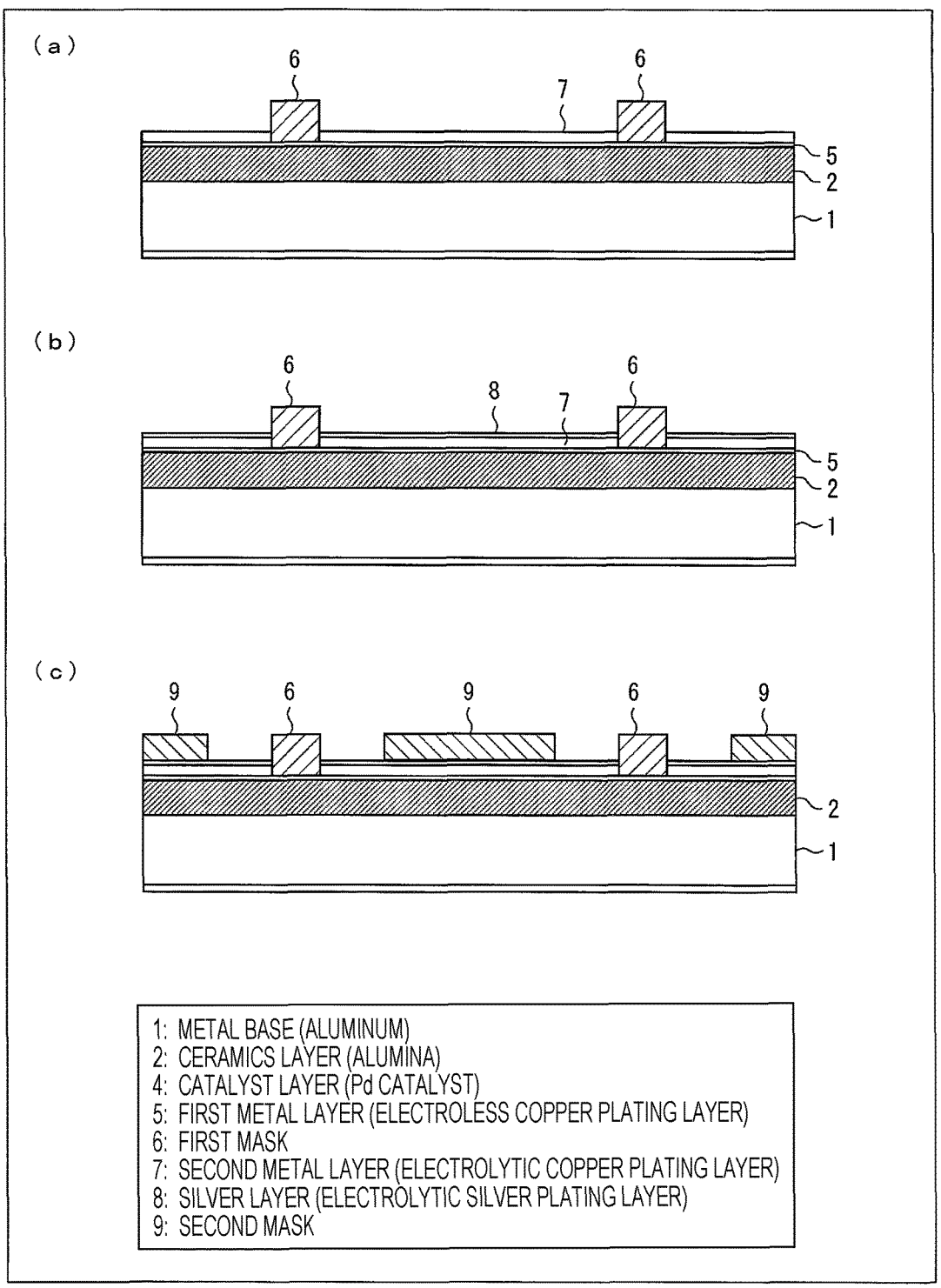
FIG. 3 is a view illustrating a manufacturing process of the circuit board according to Embodiment 1 of the present invention.

As illustrated in FIG. 2(*c*), when forming a first mask 6 to be in contact with the first metal layer 5 formed on the ceramics layer 2, it is possible to perform the electrolytic plating treatment using the first metal layer 5 as an electrode, and thus, it is possible to precipitate the metal from plating liquid on the first metal layer 5. As a result, as illustrated in FIG. 3(*a*), the thick second metal layer 7 is formed. At this time, it is preferable to precipitate metal having excellent electrical conduction properties and thermal conduction properties, for example, copper. In order to increase reflectivity by suppressing absorption of light by the electrode pattern made of copper, the silver layer 8 may be formed by the electrolytic plating or the like by covering the thick electrode layer (FIG. 3(*b*)).

Figure 4:
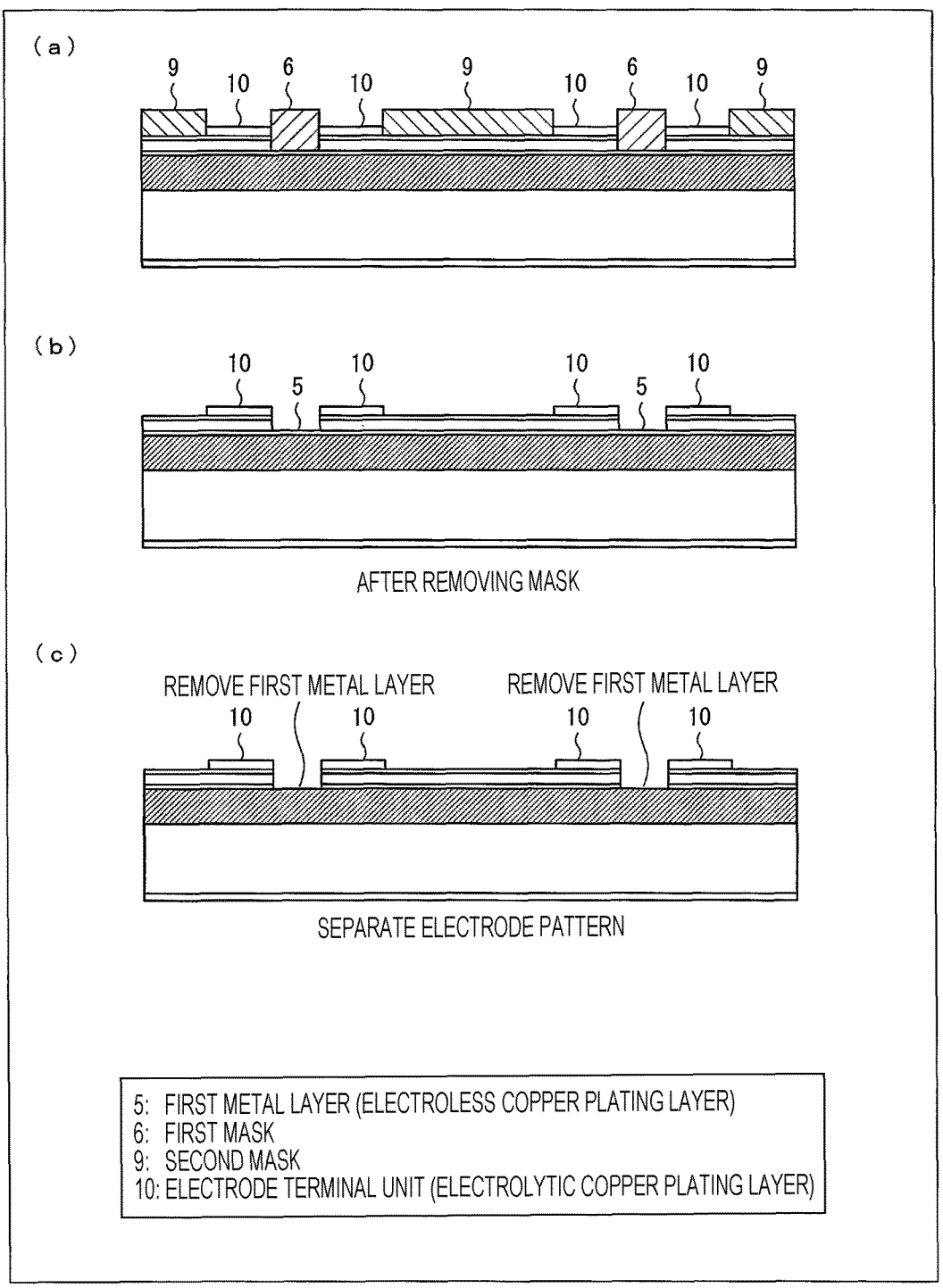
FIG. 4 is a view illustrating a manufacturing process of the circuit board according to Embodiment 1 of the present invention.

Furthermore, in a case of forming the electrode terminal for loading the light emitting element or for being connected to the external power source or the like, as illustrated in FIG. 3(*c*), by using a second mask 9, as illustrated in FIG. 4(*a*), the electrode terminal unit 10 may be formed. In the electrode terminal unit 10, metal having excellent electrical conduction properties and thermal conduction properties, such as copper, may be used. The surface of the electrode terminal unit 10 may be used while being copper, but may be protected by other types of metal, such as Au. In order to cover the electrode terminal unit with Ni/Pd/Au, the plating treatment may be performed continuously to the forming of the electrode terminal unit 10, and additionally, the plating treatment may be performed after forming a light reflection layer 11 illustrated in FIG. 5(*a*) which will be described later.

Here, since the metal base 1 is covered with the protective layer 3 or the mask, in a case of performing the plating treatment, there is no concern that the metal base 1 is eroded by the plating liquid. In particular, the metal base 1 is stably protected by being covered with the protective layer 3 made of alumite.

After forming the electrode terminal unit 10, the first mask 6 and the second mask 9 are removed, and as illustrated in FIG. 4(*b*), after exposing the conductive layer (first metal layer 5), the metal layers are separated from each other by removing the exposed first metal layer 5 by etching, as illustrated in FIG. 4(*c*), the electrode pattern is formed. Since the thickness of the first metal layer 5 is extremely thin to be equal to or less than 1 μm, it is possible to easily remove the first metal layer 5 with an etchant. In the embodiment, since copper is used as a material of the first metal layer 5, it is possible to easily remove the first metal layer 5 by iron(III) chloride (synonym: ferric chloride) solution. In addition, to remove the residues of the palladium catalyst, immersion into the cyanogen-based compound, for example, potassium cyanide solution, may be employed. The cyanogen-based compound is also a toxic substance, but may be a material which is commonly used in the plating treatment process. In addition, a residual removal agent of the palladium catalyst made of non-cyanogen-based compound that does not use the cyanogen-based compound is also commercially available, and may be used.

In the embodiment, in order to ensure the adhesive properties of copper with the ceramics layer 2, it is not necessary to insert the thin film of metal having a high melting point, such as Ni, Ti, Co, and Cr, and therefore, in order to form the electrode pattern by removing the seed metal made of Ni, Ti, Co, and Cr, similar to PTL 1 (Japanese Unexamined Patent Application Publication No. 2013-102046), it is also not necessary to use hydrofluoric acid which is toxic substance.

This is possible because it is possible to sufficiently ensure the adhesion of the ceramics layer 2 and the first metal layer 5 even when directly forming copper as the first metal layer 5 without interposing the metal layer of Ni, Ti, Co, and Cr since the surface of the ceramics layer formed by a method of injecting the ceramics particles toward the metal base 1 at a high speed and depositing the ceramics particles, which is called the thermal spraying and the AD method, is appropriately coarse. As a result, it is not necessary to use metal, such as Ni, Ti, Co, and Cr, as a ground metal for forming the electrode pattern, and it is also not necessary to use hydrofluoric acid which is a toxic substance inevitable for removing these types of metal.

In addition, in the ceramics layer formed by the thermal spraying or the AD method, only by the methods, fine pores exist. In a case of using hydrofluoric acid in the manufacturing process, the hydrofluoric acid infiltrated from the fine pores reaches the metal base 1, intrudes into a joining surface of the metal base 1 and the ceramics layer 2, and peels the ceramics layer. Therefore, a case of using the hydrofluoric acid in the etching process of the first metal layer 5, and originally, a case of using metal, such as Ni, Ti, Co, and Cr, in the first metal layer 5, should be avoided.

For example, even when performing hardening after allowing a silicone-based resin, water glass, or sol-gel glass to infiltrate into the ceramics layer 2, and blocking the fine pores that exist in the ceramics layer 2, a structure shown in any material (—O—Si—O—) is a main structure, and thus, the material is still eroded by the hydrofluoric acid.

In this manner, as described in the embodiment, it is important to be capable of forming the electrode pattern on the ceramics layer 2 via the thin first metal layer 5 made of copper without interposing the metal, such as Ni, Ti, Co, and Cr, by using the ceramics layer 2 formed by the method of injecting and depositing the ceramics particles toward the base at a high speed which is called the thermal spraying or the AD method.

After completing the electrode pattern, the electrode pattern is covered with the light reflection layer 11 exposing the electrode terminal unit 10. In the light reflection layer 11, a resin including a light reflective material or glass is used. As the light reflective material, a white material, such as high reflectivity ceramics, is used in many cases. As a typical manufacturing example, paint obtained by mixing ceramics, such as titanium oxide, alumina, or silica, into a resin, or paint obtained by mixing zirconia oxide into a glass original material, is printed on the electrode pattern. When using the screen printing, the printing is possible to expose the electrode terminal unit 10. After this, by performing the hardening by drying or firing, it is possible to form the light reflection layer 11.

In a case of coating the entire electrode pattern with the paint by using spray coating, the electrode terminal unit 10 is also covered with the paint, and thus, after hardening the paint, it is necessary to expose the electrode terminal unit 10 by polishing or the like.

In a method other than the method which uses the resin including a light reflective material or glass, as a material used in the light reflection layer 11, there is a case of directly using the light reflective material, such as the ceramics particles. In forming the light reflection layer 11 by using the material, for example, there is a method of injecting the ceramics particles toward the electrode pattern at a high speed and depositing the ceramics particles. A representative example of such a method includes the thermal spraying or the AD method (aerosol deposition method), and the method is further divided by a method of generating a high speed particle fluence. In the method, since the electrode terminal unit 10 is also covered with the light reflection layer immediately after depositing the light reflection layer made of ceramics, it is still necessary to expose the electrode terminal unit 10 by polishing or the like.

In this manner, the circuit board 320 (substrate for a high-brightness light emitting device) illustrated in FIG. 5(a) can be prepared. Furthermore, by loading the light emitting element 12 on the circuit board 320 illustrated in FIG. 5(a), the light emitting device illustrated in FIG. 5(b) is finished. In this case, the light emitting element 12 may be connected to the electrode terminal unit 10 by using the solder. As the solder to be used, the eutectic solder of AuSn or a Sn—Ag—Cu-based solder may be appropriately selected in accordance with use environment and use condition of the light emitting device.

In addition, the ceramics which are repeatedly mentioned in the present invention are not limited to the metal oxide, and include ceramics in a broad sense including aluminum nitride, silicon nitride, and silicon carbide, that is, general inorganic solid body materials. Among the inorganic solid body materials, an arbitrary material which is appropriate for the purpose of the use may be employed after considering heat resisting properties, thermal conduction properties, insulation pressure resistance or light reflection properties.

(Modification Example 1)

As Modification Example 1 of the embodiment, other methods (the thermal spraying and the AD method) of forming the thin first metal layer 5 will be described.

In the Embodiment 1, as a method of forming the first metal layer 5 on the ceramics layer 2, a method of forming a thin plating layer of copper by performing the electroless plating method on the surface of the ceramics layer covered with the catalyst is described, but a method of forming the first metal layer 5 and achieving an electrical conductive layer on the ceramics layer 2 is not limited thereto.

As other methods, a method of injecting the metal particles at a high speed and depositing the metal particles may be employed. Representative examples of the method include the thermal spraying or the AD method (aerosol deposition method). In the AD method, it is possible to make the thickness of the first metal layer 5 to be equal to or less than 1 μm. Meanwhile, in the thermal spraying, the thickness is approximately 20 to 30 μm which is thicker than that of the AD method. It is possible to laminate the metal to be thick by using the electrolytic plating method on the seed metal made of the first metal layer 5 prepared in this manner. After this, the electrode pattern may be formed following the order which is already described in Embodiment 1.

[Embodiment 2]

Another embodiment of the present invention will be described as follows. In addition, for convenience of the description, members having the same functions as the members described in the above-described embodiment will be given the same reference numerals, and the description thereof will be omitted.

FIGS. 6 to 10 are views illustrating a manufacturing process of the light emitting device according to the embodiment.

Figure 5:
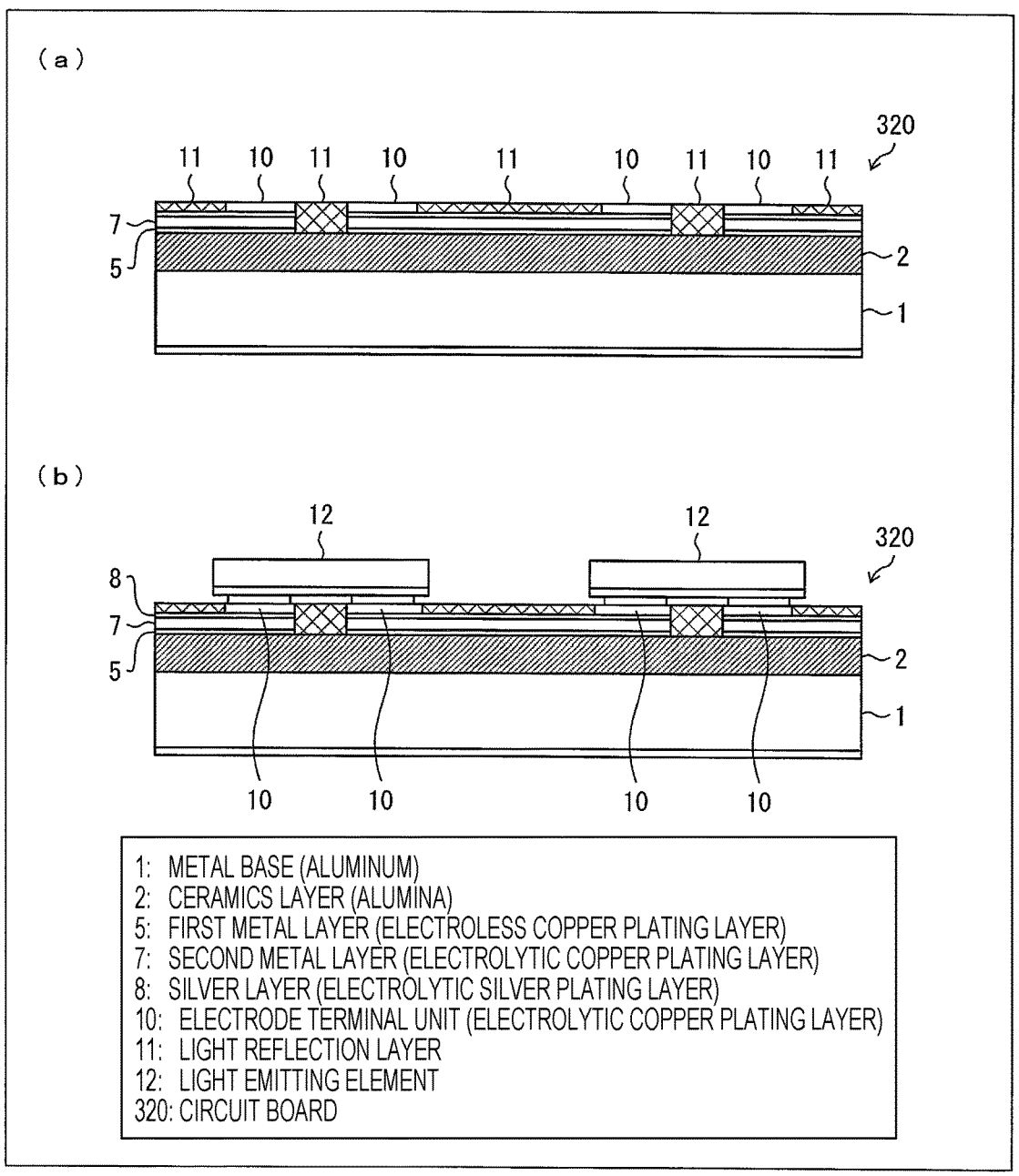
FIG. 5 is a view illustrating a manufacturing process of the circuit board according to Embodiment 1 of the present invention.
Figure 10:
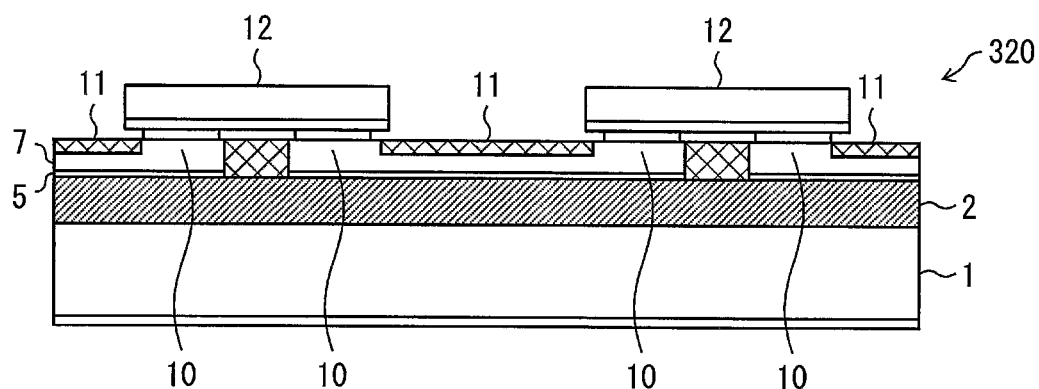
FIG. 10 is a sectional view of a schematic configuration of the circuit board according to Embodiment 2 of the present invention.

The light emitting device according to the embodiment has substantially the same configuration as that of the light emitting device illustrated in FIG. 5(*b*) of the Embodiment 1, but as illustrated in FIG. 10, the embodiment is different from Embodiment 1 in that the electrode terminal unit 10 is formed integrally with the second metal layer 7. In other words, in the light emitting device illustrated in FIG. 10, while the electrode terminal unit 10 and the second metal layer 7 are integrally formed, in the light emitting device of the Embodiment 1, as illustrated in FIG. 5(*b*), the silver layer 8 is formed between the electrode terminal unit 10 and the second metal layer 7.

Hereinafter, the manufacturing of the light emitting device according to the embodiment will be described.

<Electrode Forming Method 2>

(Preparation of Ground of Insulation Substrate Which Uses Metal Base)

Figure 6:
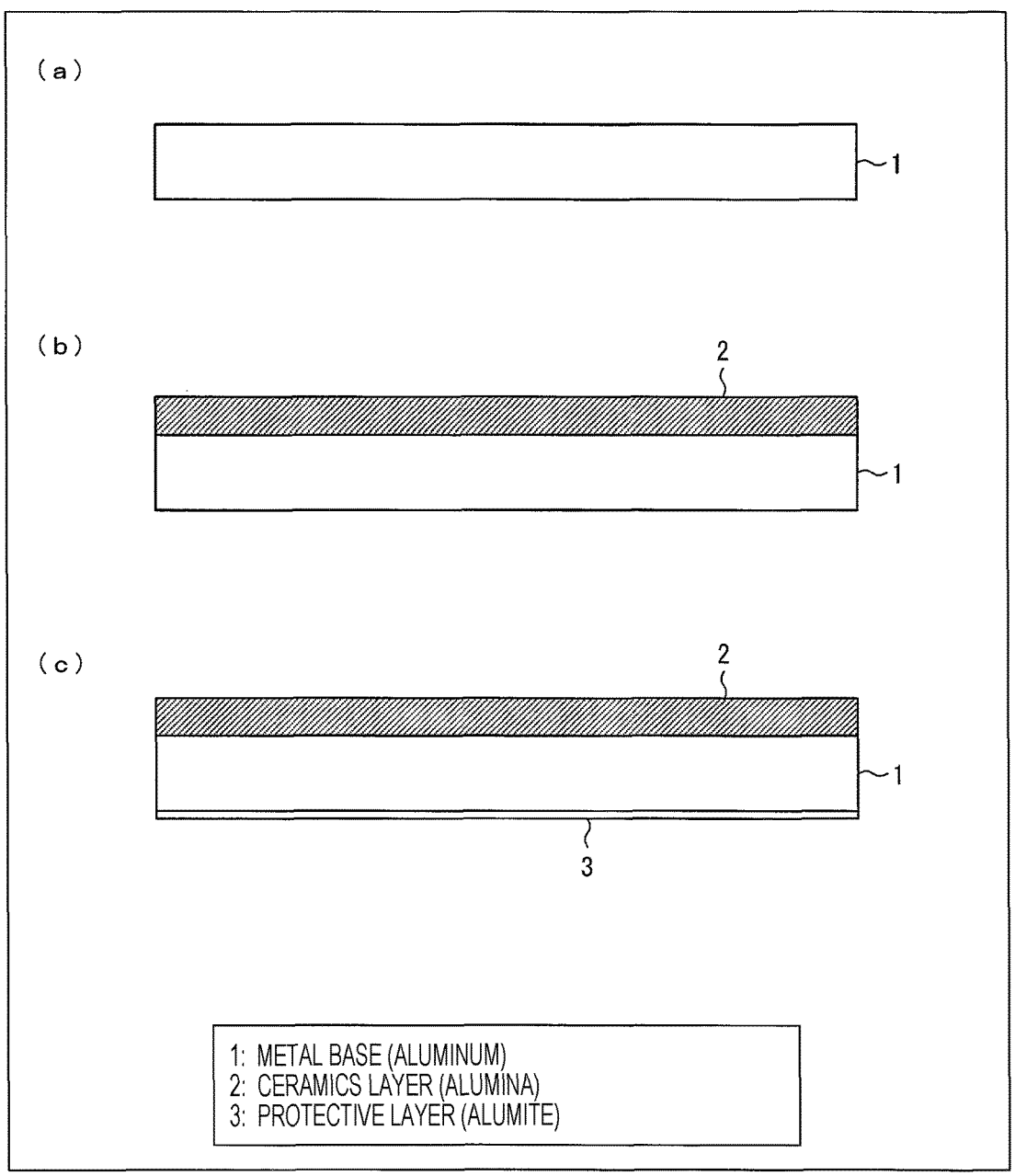
FIG. 6 is a view illustrating a manufacturing process of a circuit board according to Embodiment 2 of the present invention.

In the embodiment, a method of preparing the ground of the insulation substrate which uses the aluminum as the metal base 1, follows the method illustrated in FIGS. 1(*a*) to 1(*c*) in Embodiment 1, and here, the description thereof will be omitted. FIGS. 6(*a*) to 6(*c*) which correspond to the embodiment are illustrated in views similar to FIGS. 1(*a*) to 1(*c*) which correspond to the Embodiment 1.

(Electrode Forming: Second Method)

Here, a method of forming the electrode layer on the ground of the insulation substrate prepared in the above-described order will be described.

Figure 7:
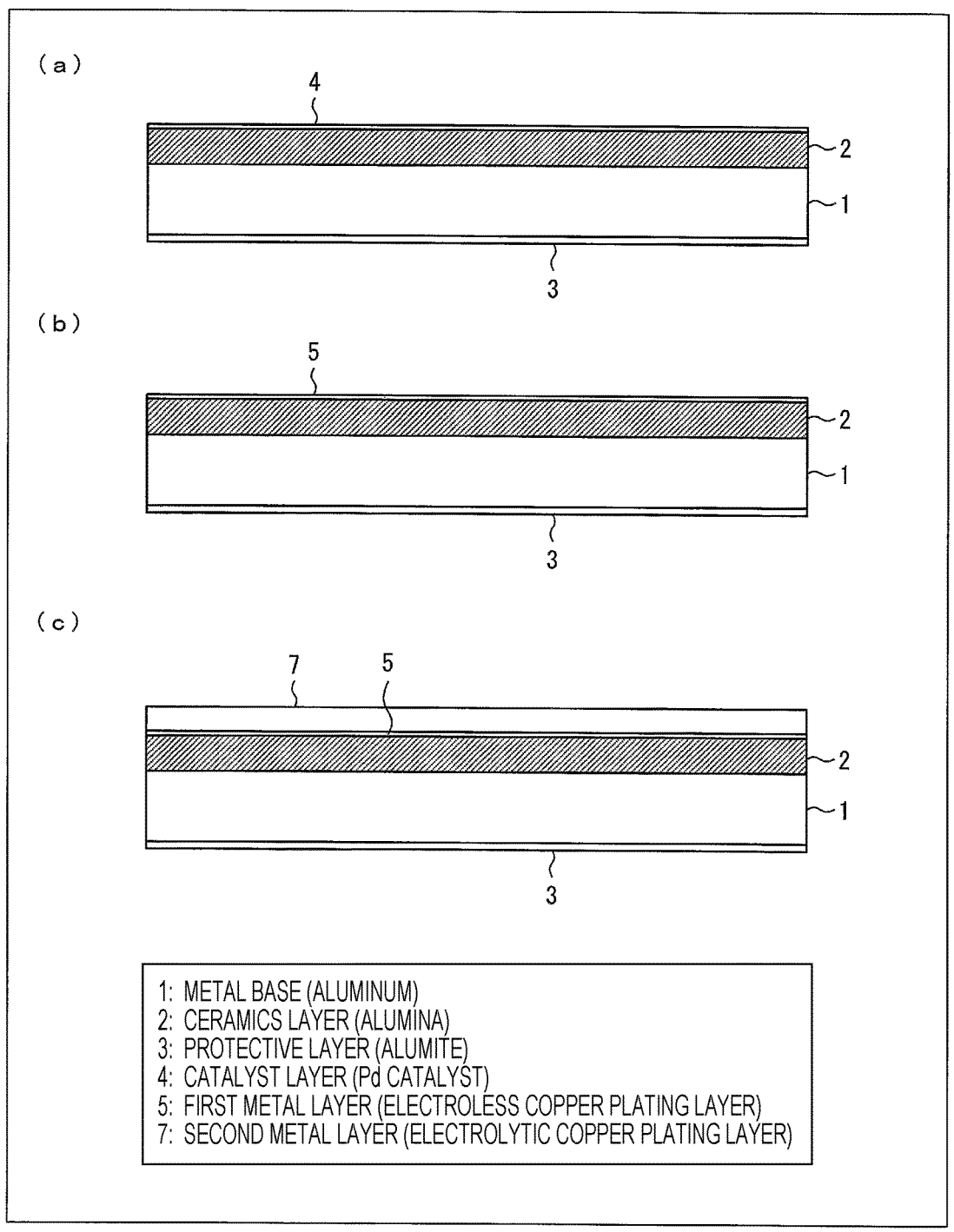
FIG. 7 is a view illustrating a manufacturing process of the circuit board according to Embodiment 2 of the present invention.

First, as illustrated in FIG. 7(*b*), the thin first metal layer 5 is formed on the ceramics layer 2. The processing until here follows the processing until FIG. 2(*b*) of the Embodiment 1. Similar to the Embodiment 1, the method of forming the first metal layer 5 may be the electroless plating method which uses the catalyst, or may be a method illustrated in Modification Example 1, that is, other methods, such as the thermal spraying or the AD method. It is possible to laminate the metal to be thick by using the electrolytic plating method on the first metal layer 5 prepared in this manner. In other words, using the first metal layer 5 as an electrode, the metal is precipitated from the plating liquid on the first metal layer 5, and as illustrated in FIG. 7(*c*), the thick second metal layer 7 is formed to be one surface on the first metal layer 5.

By the metal layer configured of the first metal layer 5 and the second metal layer 7 prepared in this manner, the electrode pattern is formed by using the etching. At this time, it is desirable to form the electrode pattern by repeating the forming of a mask having an opening unit that corresponds to necessary electrode pattern and the etching (FIGS. 8(*a*) to 9(*b*)).

The photomask may be formed by using the photoresist, or may form the mask by using the insulating adhesive sheet.

Figure 8:
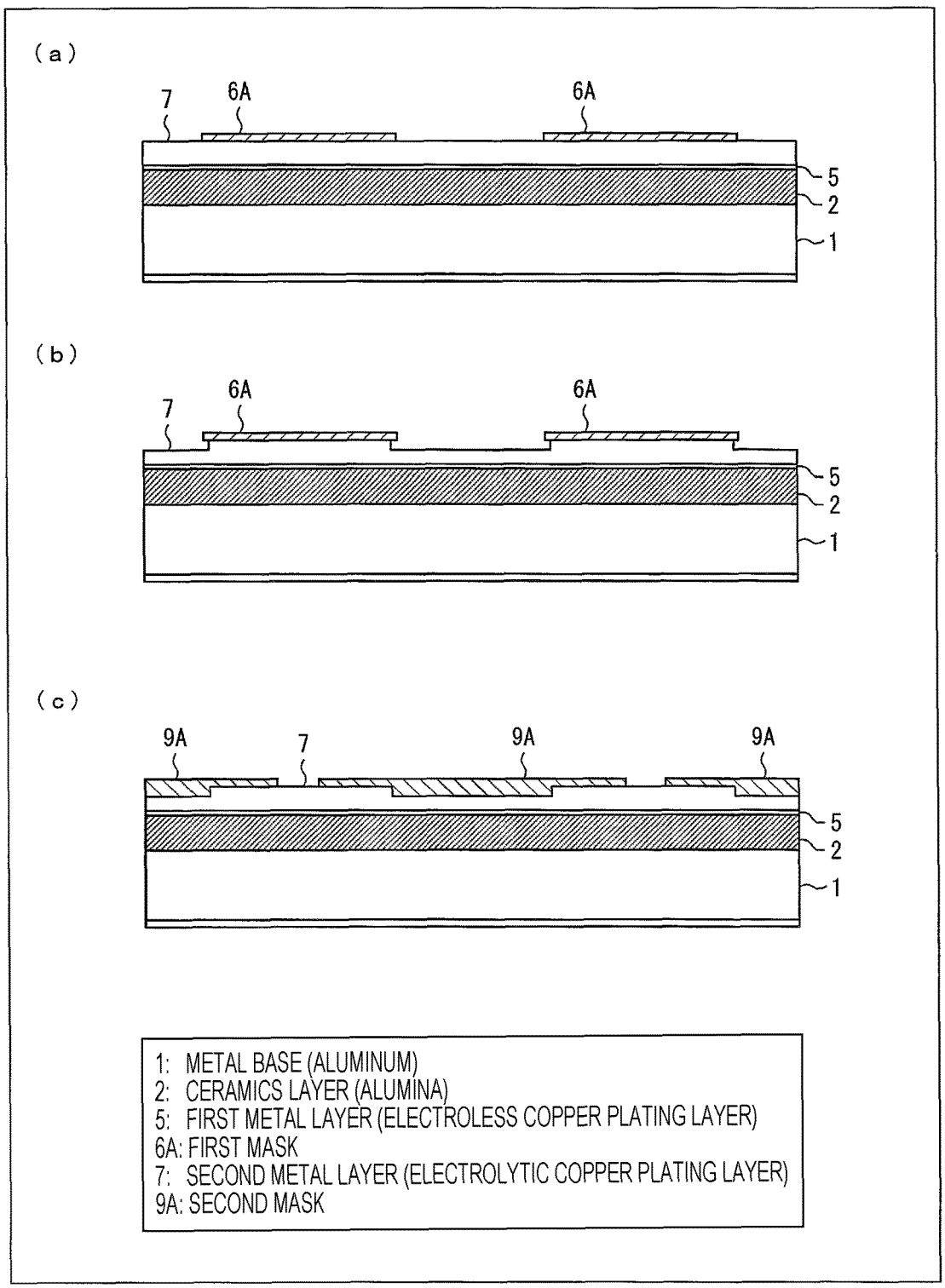
FIG. 8 is a view illustrating a manufacturing process of the circuit board according to Embodiment 2 of the present invention.

As described illustrated in FIG. 8(*a*), a first mask 6A is formed to be in contact with the second metal layer 7, and the etching treatment is performed. As a result, the thick metal layer 7 is engraved by the etching to the middle part remaining the part which is used as the electrode terminal unit and the electrode pattern (FIG. 8(*b*)).

Figure 9:
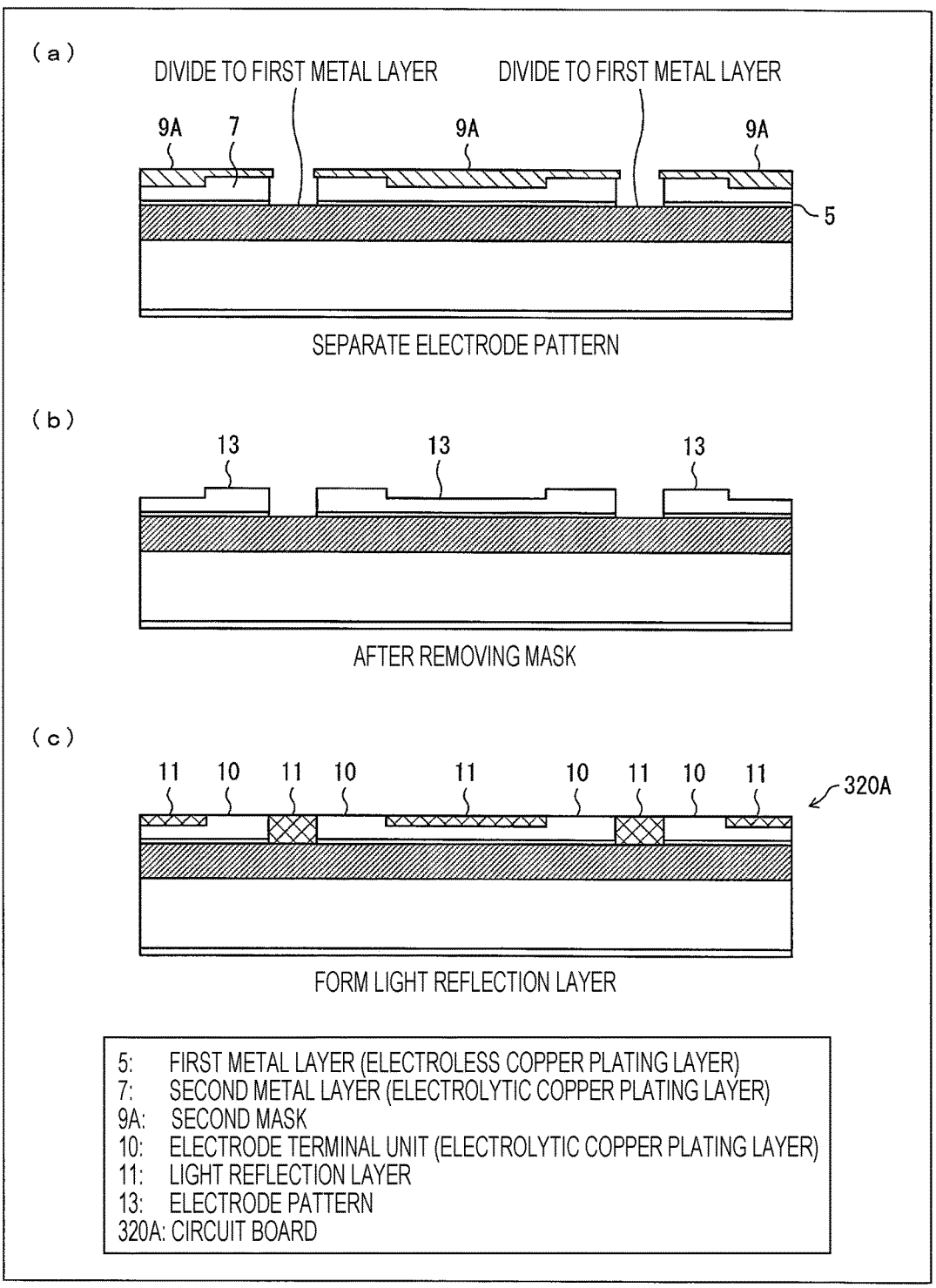
FIG. 9 is a view illustrating a manufacturing process of the circuit board according to Embodiment 2 of the present invention.

After removing the first mask 6A, as illustrated in FIG. 8(*c*), after forming a second mask 9A on the remaining second metal layer 7, further, the second metal layer 7 and the first metal layer 5 are engraved in order, the etching is performed until reaching the ceramics layer 2 (FIG. 9(*a*)), and an electrode pattern 13 is carved from the metal layer (the first metal layer 5 and the second metal layer 7) (FIG. 9(*b*)).

When both of the first metal layer 5 and the second metal layer 7 are formed of copper, by using the iron(III) chloride (synonym: ferric chloride) solution similar to Embodiment 1, it is possible to form the electrode pattern 13 from the metal layer. In Embodiment 2, by the reason similar to that of the Embodiment 1, Ni, Ti, Co, and Cr may also not be used in the thin first metal layer 5, and thus, it is not necessary to use hydrofluoric acid as the etchant due to the similar reasons. Therefore, a problem that the ceramics layer 2 is peeled from the metal base 1 by being eroded by the hydrofluoric acid is also not generated.

In addition, in a case of using the palladium catalyst in forming the first metal layer 5, in order to remove residues of the palladium catalyst, a commercially available palladium catalyst residual removal agent may be used. A representative example of the removal agent includes cyanogen-based compound, for example, potassium cyanide solution. The residual removal agent of the palladium catalyst made of non-cyanogen-based compound is also commercially available, and the removal may be performed using this. The cyanogen-based compound is a toxic substance, but since the material is commonly used in the plating treatment, the material can be relatively easily handled in general plating treatment equipment.

After the electrode pattern 13 is completed, as illustrated in FIG. 9(*c*), the electrode pattern 13 is covered with the light reflection layer 11 to expose the electrode terminal unit 10.

The light reflective material or the forming method which is used in the light reflection layer 11, may follow the method described in the electrode forming method 1 of the Embodiment 1, and here, the description thereof will be omitted in order to avoid repeating description. Even in a case of selecting any forming method, it is necessary to expose the electrode terminal unit 10 from the light reflection layer 11. In the electrode terminal unit 10, metal having excellent electrical conduction properties and thermal conduction properties, such as copper, may be used. The surface of the electrode terminal unit 10 may use copper as it is, but may be protected by other types of metal, such as Au, and for example, the plating treatment may be performed with respect to the surface of the electrode terminal unit 10 continuously to the forming of the light reflection layer 11, and the electrode terminal unit 10 may be covered with Ni/Pd/Au.

Here, since the metal base 1 is covered with the protective layer 3 or the light reflection layer 11, in a case of performing the plating treatment, there is no concern that the metal base 1 is eroded by the plating liquid. In particular, the metal base 1 is stably protected from the plating liquid by being covered with the protective layer 3 made of alumite.

In this manner, a circuit board 320A (substrate for a high-brightness light emitting device) illustrated in FIG. 9(*c*) can be prepared. Furthermore, by loading the light emitting element 12 on the circuit board 320A illustrated in FIG. 9(*c*), the light emitting device illustrated in FIG. 10 is finished. In this case, the light emitting element 12 may be connected to the electrode terminal unit 10 by using the pattern. Similar to the electrode forming method 1 of the Embodiment 1, as the solder to be used, the eutectic solder of AuSn or a Sn—Ag—Cu-based solder may be appropriately selected in accordance with use environment and use condition of the light emitting device.

[Embodiment 3]

Another embodiment of the present invention will be described as follows. In addition, for convenience of the description, members having the same functions as the members described in each of the above-described embodiments will be given the same reference numerals, and the description thereof will be omitted.

Figure 11:
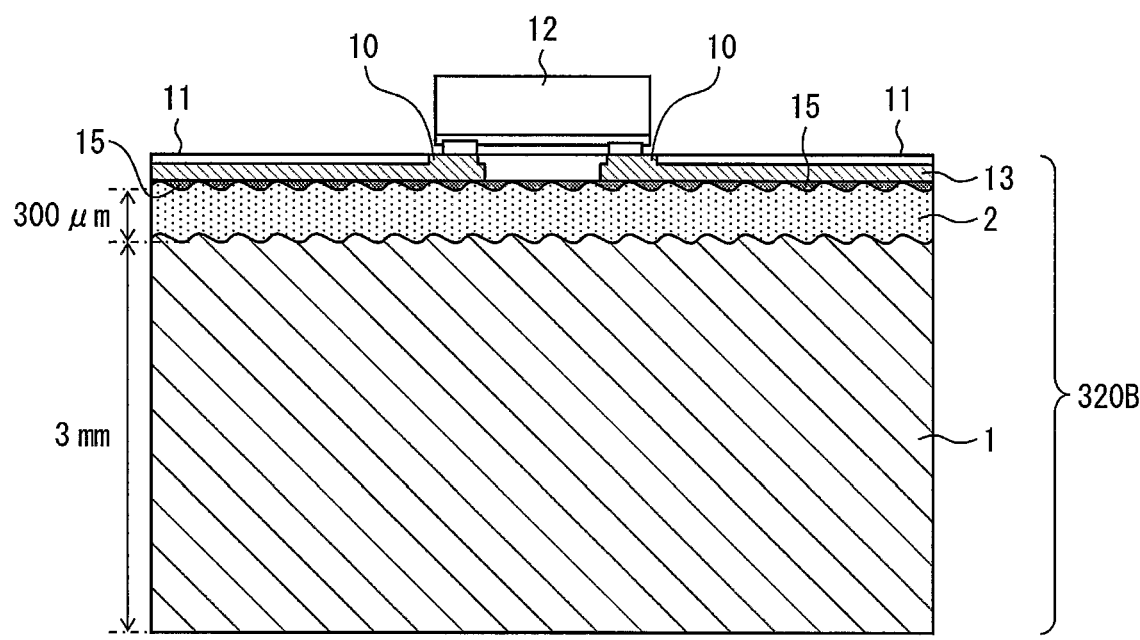
FIG. 11 is a sectional view of a schematic configuration of a light emitting device according to Embodiment 3 of the present invention.

FIG. 11 is a view illustrating a schematic configuration of the light emitting device according to the embodiment. The light emitting device according to the embodiment includes a circuit board 320B having a structure different from those of the circuit boards of the Embodiments 1 and 2.

In the light emitting device according to the embodiment, in order to realize a long life span as the light emitting device by stably loading the light emitting element 12 on the electrode terminal unit 10, it is necessary to obtain excellent flatness on the surface of the electrode terminal unit 10. In order to realize this, as illustrated in FIG. 11, in the circuit board 320B, it is preferable to interpose a flat layer 15 between the ceramics layer 2 and the thin first metal layer 5. Here, the thickness of the metal base 1 which configures the circuit board 320B is 3 mm and the thickness of the ceramics layer 2 is 300 μm.

By doing so, it is also possible to maintain the surface in a case where the thick second metal layer 7 is formed by the electrolytic plating, to be flat. Therefore, it is not necessary to perform the work of additional polishing or the like for flattening the electrode terminal unit 10, and to reduce the loss of the electrode material.

As the flat layer 15, a material which forms a resin or a glass material by using a sol-gel reaction, may be employed, but there is a case where the thermal conductivity of the materials decreases and the heat resistance of the substrate increases by forming the flat layer by the materials. In order to take a measure to avoid this, it is desirable to use the material by mixing the ceramics particles having an appropriate dimension into the material that forms the flat layer and by increasing the thermal conductivity.

The flat layer 15 is particularly efficient in a case where the ceramics layer 2 is formed by the thermal spraying. The particle size of the ceramics particles to be used in the thermal spraying is generally 10 μm to 40 μm in a case of using alumina, and the unevenness formed on the surface of the ceramics layer 2 is also substantially large to the extent. By performing the electroless plating with respect to the thin first metal layer 5 while maintaining this state, even when the thick second metal layer 7 is laminated by the electrolytic plating and the total thickness of the metal layer is equal to or greater than 100 μm, the surface of the metal layer is not flattened, and the influence of the unevenness formed on the surface of the ceramics layer 2 remains.

In order to make the flat layer by filling up the uneven surface of the ceramics layer 2 that has a negative influence, for example, after mixing an inorganic material selected by the particle size that is equal to or less than 10 μm, for example, ceramics represented by silica, alumina, aluminum nitride, and titanium oxide, into the material that forms the above-described resin or the glass material by using sol-gel reaction, the coating, the drying, the hardening, and the firing may be performed with respect to the ceramics layer 2.

Otherwise, compared to the thermal spraying, the representative dimension of the particle size of the ceramics particles used in the AD method (aerosol deposition method) is equal to or less than 2 μm, and further, the particles are injected to the substrate, ground, and laminated, a representative dimension of the particle size of the ceramics particles which configure the ceramics layer 2 formed by the AD method is further smaller and is approximately 100 nm. Therefore, for example, after forming the ceramics layer 2 made of alumina, it is also possible to form the deposited layer of the ceramics represented by alumina, and to use the layer as the flat layer 15.

When completely flattening the ceramics layer 2 by the flat layer 15, there is a case where a failure of deterioration of adhesion of the first metal layer 5 is generated. In a case where a failure is generated, the surface may become slightly coarse by lightly performing the blast treatment again with respect to the surface of the flat layer 15.

By performing the blast treatment by using fine abrasive particles, a small uneven shape, for example, which is equal to or less than 5 μm, and desirably equal to or less than 2 μm, is formed on the surface of the flat layer 15. In the Embodiment 1, on the surface of the ceramics layer 2 formed by the thermal spraying, a large uneven shape which has a depth of, for example, approximately 5 to 20 μm, exists, but in a case of performing the blast treatment by the fine abrasive particles after filling up the unevenness once by the flat layer 15, the flat layer 15 functions as a practically flat surface with respect to the surface of the ceramics layer 2. This is, originally, for replacing the surface with the surface having a small uneven shape that is substantially equal to or less than 5 μm across the entire surface, and desirably equal to or less than 2 μm, by practically removing the large uneven structure which exists on the surface of the ceramics layer 2 and exceeds, for example, 5 μm, at the beginning.

As the small unevenness exists on the surface, the flat layer 15 obtained in this manner gives an anchor effect to the first metal layer 5, and can achieve sufficient adhesion. Additionally, in a case of forming the second metal layer 7 by the electrolytic plating on the first metal layer 5, the first metal layer 5 practically functions as the flat layer. This is because it is possible to use the surface in a case where the second metal layer 7 is formed as a flat surface since it is possible to remove the large unevenness which is seen on the surface of the ceramics layer 2 and exceeds, for example, 5 μm, and to control the unevenness to be equal to or less than 5 μm and to be desirably equal to or less than 2 μm, by interposing the flat layer 15.

According to this, it is not necessary to perform the work of additional polishing or the like for flattening the electrode terminal unit 10, and it is also possible to reduce the loss of the electrode material.

[Embodiment 4]

Another embodiment of the present invention will be described as follows. In addition, for convenience of the description, members having the same functions as the members described in each of the above-described embodiments will be given the same reference numerals, and the description thereof will be omitted.

In the embodiment, an illumination device that forms the light emitting device which has the light emitting element loaded thereon on the circuit board described in the Embodiments 1 to 3, and further, includes the light emitting device, will be described.

(Configuration of Illumination Device 101)

Figure 12:
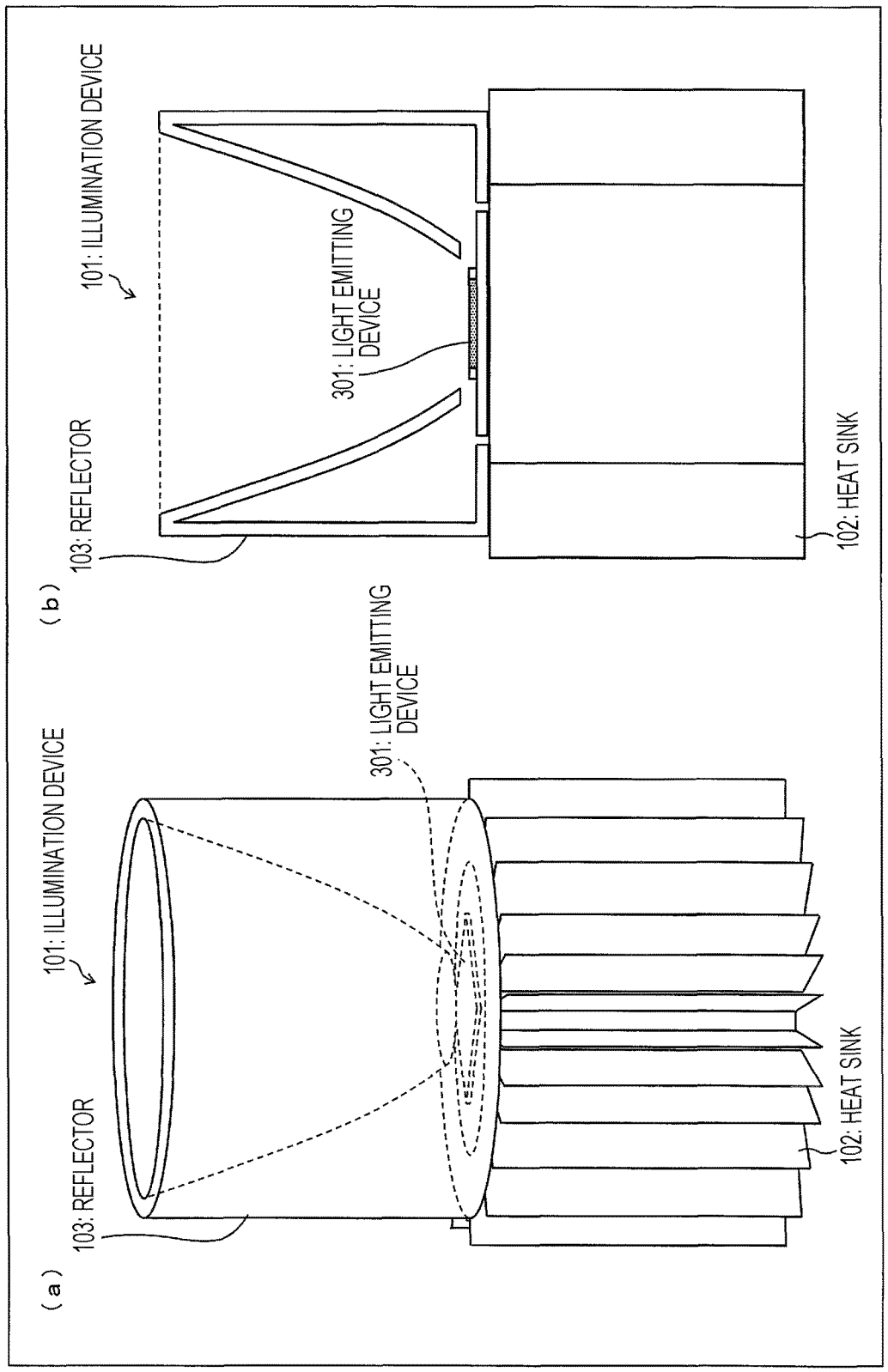
FIG. 12 is a schematic configuration view of an illumination device according to Embodiment 4 of the present invention.

FIG. 12(a) is a perspective view illustrating an external appearance of an illumination device 101 according to Embodiment 4, and FIG. 12(b) is a sectional view of the illumination device 101. The illumination device 101 includes the light emitting device 301, a heat sink 102 for radiating heat generated from the light emitting device 301, and a reflector 103 which reflects the light emitted from the light emitting device 301. Since the configuration of the light emitting device 301 is the same as that of the light emitting device described in the Embodiments 1 to 3, the detailed description thereof will be omitted.

Figure 13:
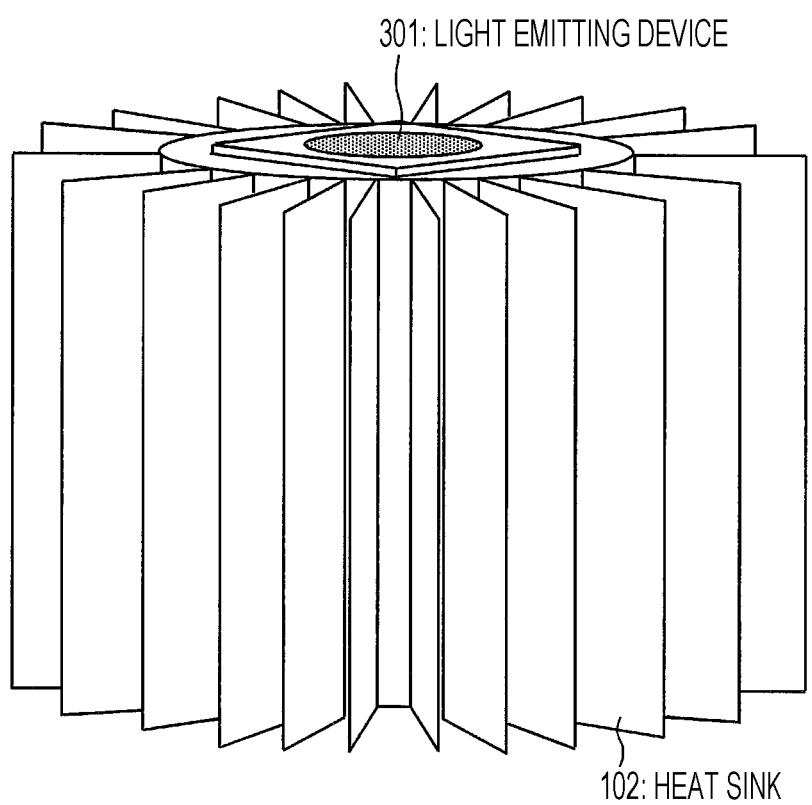
FIG. 13 is a perspective view illustrating an external appearance of a light emitting device and a heat sink which configure the illumination device illustrated in FIG. 12.

FIG. 13 is a perspective view illustrating an external appearance of the light emitting device 301 and the heat sink 102. The light emitting device 301 may be used being mounted on the heat sink 102.

Figure 14:
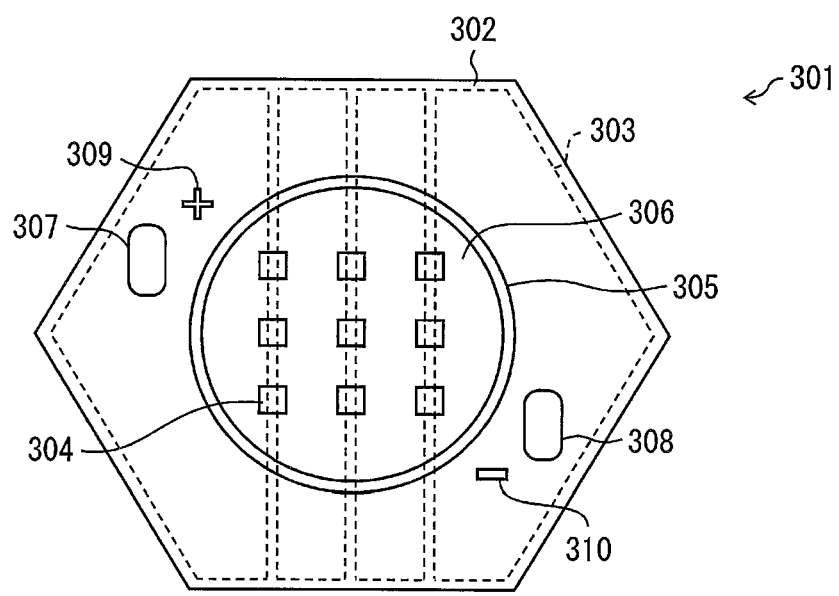
FIG. 14 is a plan view illustrating a configuration of the light emitting device which configures the illumination device illustrated in FIG. 12.
Figure 15:
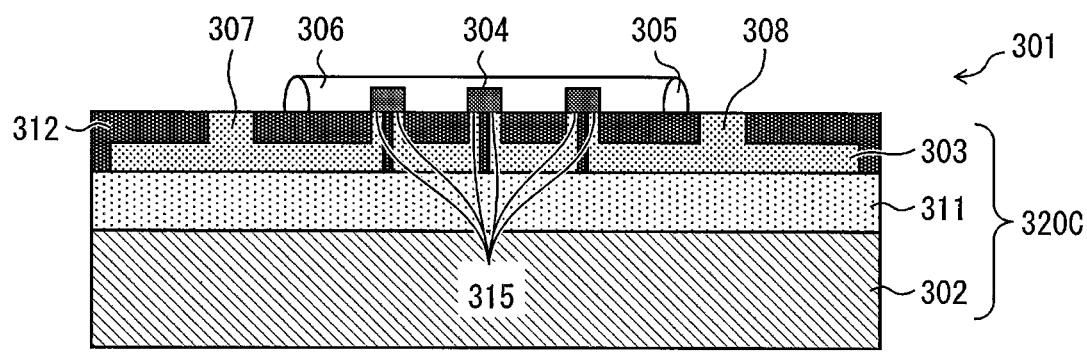
FIG. 15 is a schematic sectional view of the light emitting device illustrated in FIG. 14.

As illustrated in FIGS. 14 and 15, the light emitting device 301 includes a circuit board 320C and a light emitting element 304. The circuit board 320C includes a metal base 302, an intermediate layer (first electrical insulation layer) 311 (illustrated in FIG. 15), an electrode pattern (wiring pattern) 303, and a reflection layer (second electrical insulation layer) 312 (illustrated in FIG. 15).

Here, the circuit board 320C is a representative example of the circuit board prepared by the method described in the Embodiments 1 to 3, and the light emitting device 301 is a representative example of a case where the light emitting element 304 is loaded on the circuit board disclosed in the Embodiments 1 to 3. Therefore, the intermediate layer 311 which configures the circuit board 320C corresponds to the ceramics layer 2 of the Embodiments 1 to 3, and the electrode pattern 303 corresponds to the electrode pattern of the Embodiments 1 to 3. In other words, the electrode pattern 303 is formed as a predetermined pattern by performing etching or the like with respect to the thin first metal layer 5 and the thick second metal layer 7 which are laminated on the intermediate layer 311.

The light emitting element 304 is electrically connected to the electrode pattern 303, and in FIG. 14, nine light emitting elements (LED chips) 304 disposed in three lines and three rows are illustrated. The nine light emitting elements 304 are connected in parallel in three rows by the electrode pattern 303 and have a connected configuration (that is, three in series and three in parallel) including a series circuit of three light emitting elements 304 in each of the three rows. It is needless to say that the number of light emitting elements 304 is not limited to nine, and may not have a connection configuration of three in series and three in parallel.

Furthermore, the light emitting device 301 includes a light reflection resin frame 305, a sealing resin containing phosphor 306, an anode electrode (anode land or anode connector) 307, a cathode electrode (cathode land or cathode connector) 308, an anode mark 309, and a cathode mark 310.

The light reflection resin frame 305 is a circular (arc-shaped) frame which is provided on the electrode pattern 303 and the reflection layer 312 and is made of a silicone resin containing an alumina filler. The material of the light reflection resin frame 305 is not limited thereto, and may be a light reflective insulation resin. The shape thereof is also not limited to the circular (arc-shaped) shape, and can be an arbitrary shape.

The sealing resin containing phosphor 306 is a sealing resin layer made of a light-transmitting resin. The sealing resin containing phosphor 306 fills a region surrounded by the light reflection resin frame 305, and seals the light emitting element 304 and the reflection layer 312. In addition, the sealing resin containing phosphor 306 contains phosphor. As the phosphor, phosphor which is excited by primary light radiated from the light emitting element 304, and radiates the light having a longer wavelength than that of the primary light.

In addition, the configuration of the phosphor is not particularly limited, and can be appropriately selected in accordance with desirable chromaticity or the like of white color. For example, as a combination of neutral white and light bulb color, a combination of YAG yellow phosphor and red phosphor $(Sr,Ca)AlSiN_3$:Eu, or a combination of YAG yellow phosphor and red phosphor $CaAlSiN_3$:Eu, can be used. In addition, as a combination of high rendering color, a combination of red phosphor $(Sr,Ca)AlSiN_3$:Eu and green phosphor $Ca_3(Sc,Mg)_2Si_3O_{12}$:Ce, or a combination with green phosphor $Lu_3Al_5O_{12}$:Ce, can be used. In addition, the combination of other types of phosphor may be used, and a configuration which only includes the YAG yellow phosphor as pseudo white color may also be used.

The anode electrode 307 and the cathode electrode 308 are electrodes which supply a current for driving the light emitting element 304, to the light emitting element 304, and are provided in a shape of a land. The anode electrode 307 and the cathode electrode 308 may be provided in a shape of a connector by installing the connector in the land unit. The anode electrode (anode land or anode connector) 307 and the cathode electrode (cathode land and cathode connector) 308 are electrodes which can be connected to an external power source that is not illustrated in the light emitting device 301. In addition, the anode electrode (anode land or anode connector) 307 and the cathode electrode (cathode land and cathode connector) 308 are connected to the light emitting element 304 via the electrode pattern 303.

In addition, the anode mark 309 and the cathode mark 310 are respectively alignment marks which become references for performing the positioning with respect to the anode electrode (anode land or anode connector) 307 and the cathode electrode (cathode land and cathode connector) 308. In addition, the anode mark 309 and the cathode mark 310 respectively have a function of showing a polarity of the anode electrode (anode land or anode connector) 307 and the cathode electrode (cathode land and cathode connector) 308.

In addition, the thickness of the part of the electrode pattern 303 immediately below the anode electrode (anode land or anode connector) 307 and the cathode electrode (cathode land and cathode connector) 308 is greater than the thickness (in the electrode pattern 303 of FIG. 15, a part which corresponds to the part covered with the reflection layer 312) of a part of the electrode pattern 303 which is at a position other than the position immediately below the electrodes.

(Heat Resistance Reducing Effect)

Here, a heat resistance reducing effect in the circuit board which is described in the Embodiments 1 to 4 will be described hereinafter.

Figure 16:
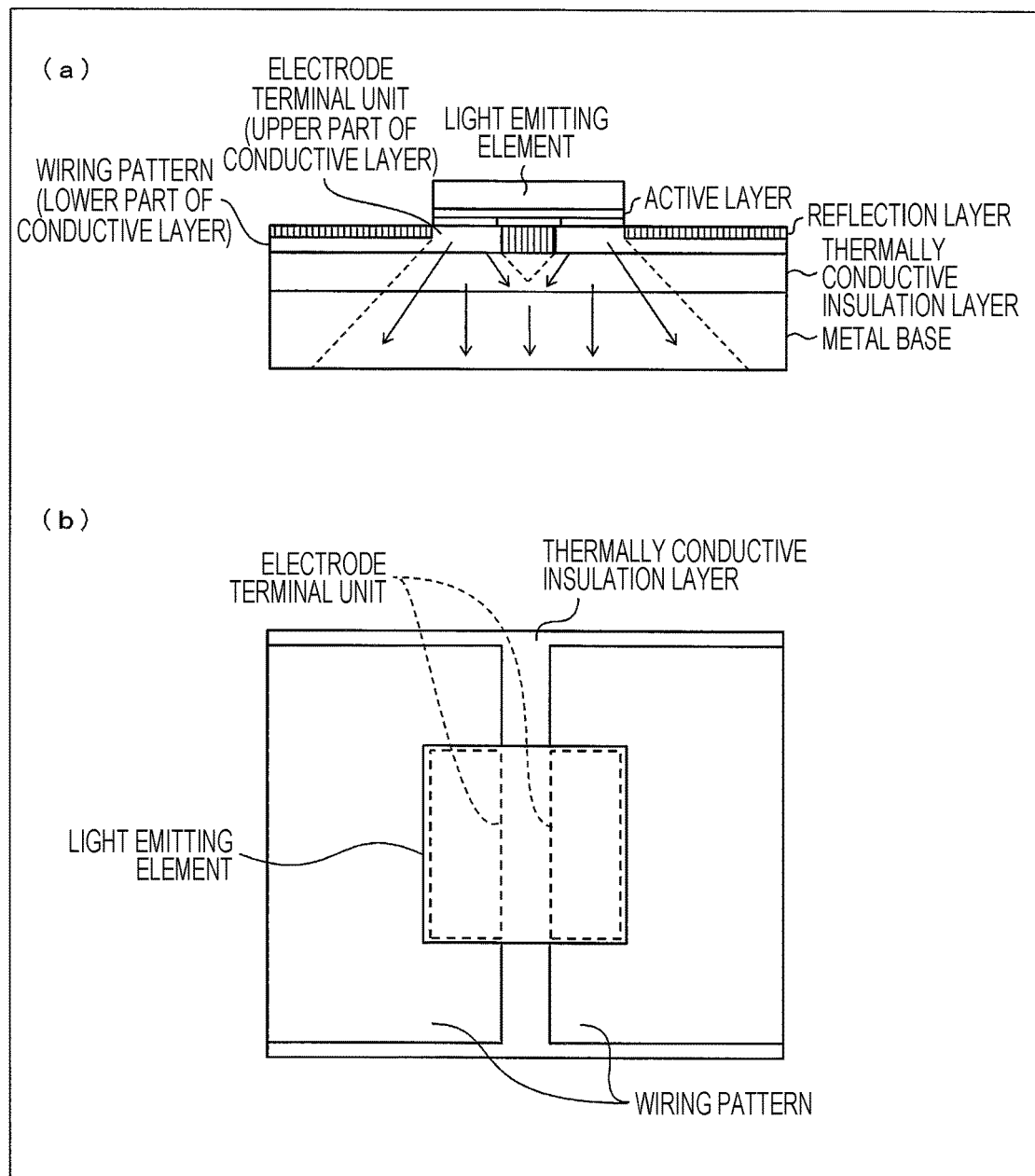
FIG. 16 is a first schematic view for calculating heat resistance.

FIG. 16 illustrates an example of a schematic view of the light emitting device for calculating the heat resistance. FIG. 16(*a*) is a sectional view of the light emitting device, and FIG. 16(*b*) is a plan view of the light emitting device. In addition, in FIG. 16(*b*), for convenience of description, a plane of the light emitting device in a state where the reflection layer is peeled is illustrated.

Here, in the light emitting device, as illustrated in FIG. 16(*a*), the heat generated by the light emitting element diffuses while spreading in a direction of 45° toward the metal base through the wiring pattern from the light emitting element.

However, in FIGS. 16(*a*) and 16(*b*), since the thermally conductive insulation layer exists immediately below the light emitting element, heat sources from the light emitting element are at two locations (on the anode side and on the cathode side of the electrode terminal), and the calculation of the heat resistance becomes slightly complicated. Therefore, in order to further simplify the calculation of the heat resistance, schematic views of the light emitting device illustrated in FIGS. 17(*a*) and 17(*b*) are used.

Figure 17:
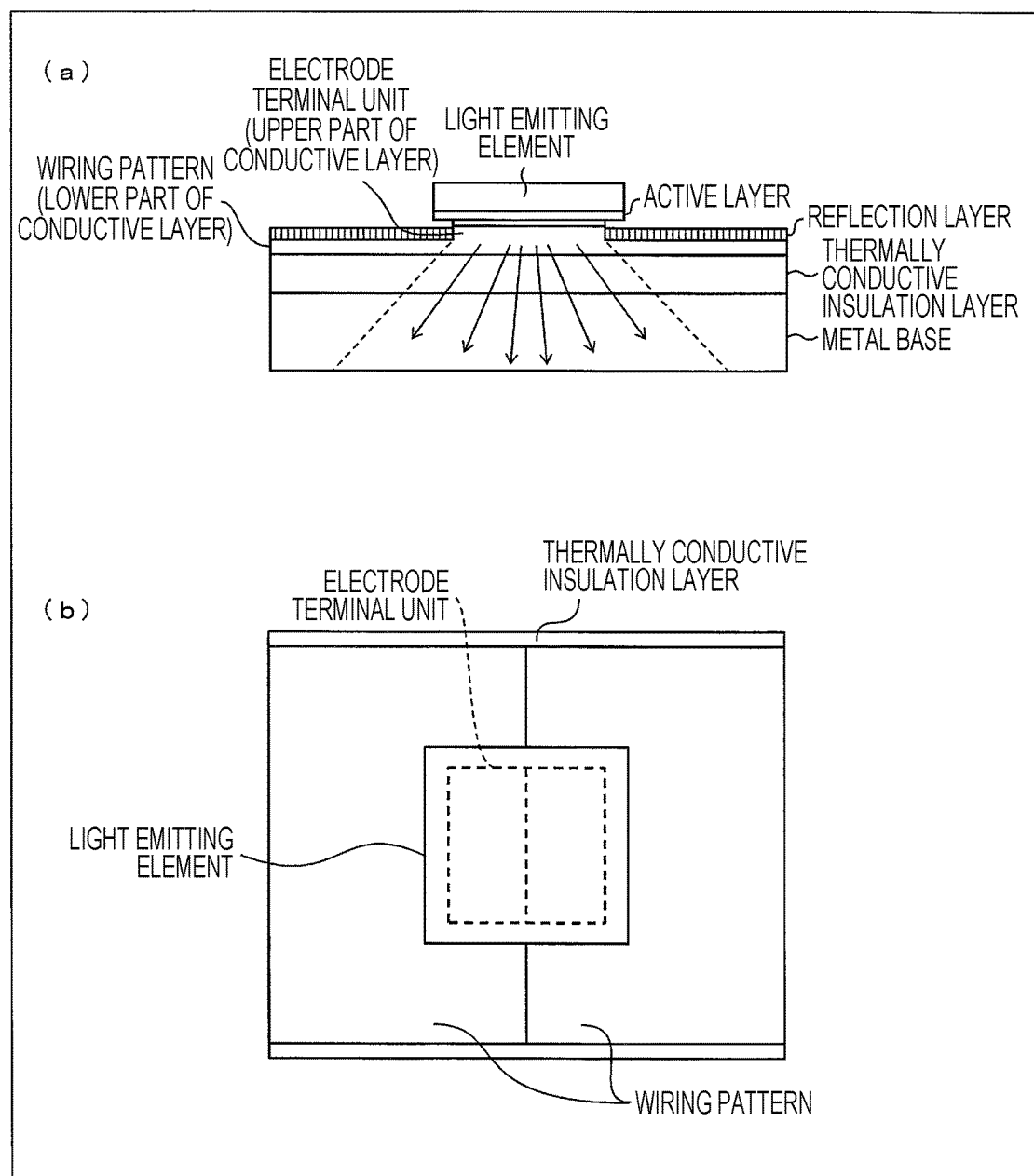
FIG. 17 is a second schematic view for calculating heat resistance.

FIG. 17 illustrates an example of a schematic view of the light emitting device for calculating the heat resistance simplified compared to FIG. 16, FIG. 17(a) is a sectional view of the light emitting device, and FIG. 17(b) is a plan view of the light emitting device. In addition, in FIG. 18(b), for convenience of description, a plane of the light emitting device in a state where the reflection layer is peeled is illustrated.

In the light emitting device illustrated in FIGS. 17(a) and 17(b), since the heat source from the light emitting element can be at one location (the anode and the cathode of the electrode terminal are considered as one), it is possible to simplify the calculation of the heat resistance.

Therefore, here, the heat resistance of the entire circuit board in the light emitting device illustrated in FIGS. 17(a) and 17(b) is calculated.

Here, in the light emitting element, one side has a square shape of 500 μm, and 70% of an area of a lower surface of the light emitting element is the same as the area of an upper surface of the electrode. In addition, by setting the area of the electrode terminal unit on which the light emitting element is loaded in the conductive layer to be the same as the electrode area of the light emitting element, the heat resistance is estimated.

When applying the thicknesses and the thermal conductivities of each layer as illustrated in the following Tables 1 to 3, the heat resistances on each corresponding layer is estimated as illustrated in the second column from the right. The power of 0.40 W is input per one light emitting element, and in a case where 50% thereof is lost as heat, a temperature increase ΔT on each layer is estimated as illustrated in the right end column.

TABLE 1

|  | Thermal conductivity W/(m · K) | Layer thickness d (mm) | Heat resistance RH K/W | Temperature increase ΔT ° C. |
| --- | --- | --- | --- | --- |
| Solder | 50 | 0.01 | 1.14 | 0.23 |
| Electrode terminal unit (upper part of conductive layer) | 300 | 0.05 | 0.95 | 0.19 |
| Wiring pattern (lower part of conductive layer) | 300 | 0.5 | 2.81 | 0.56 |
| Thermally conductive insulation layer | 5 | 0.25 | 18.38 | 3.68 |
| Metal base (aluminum) | 200 | 3 | 0.99 | 0.20 |
| Entire substrate (total) |  |  | 24.27 | 4.85 |

TABLE 2

|  | Thermal conductivity W/(m · K) | Layer thickness d (mm) | Heat resistance RH K/W | Temperature increase ΔT ° C. |
| --- | --- | --- | --- | --- |
| Solder | 50 | 0.01 | 1.14 | 0.23 |
| Electrode terminal unit (upper part of conductive layer) | 300 | 0.05 | 0.95 | 0.19 |
| Wiring pattern (lower part of conductive layer) | 300 | 0.05 | 0.77 | 0.15 |
| Thermally conductive insulation layer | 5 | 0.25 | 94.73 | 18.95 |
| Metal base (aluminum) | 200 | 3 | 2.10 | 0.42 |
| Entire substrate (total) |  |  | 99.69 | 19.94 |

TABLE 3

|  | Thermal conductivity W/(m · K) | Layer thickness d (mm) | Heat resistance RH K/W | Temperature increase ΔT ° C. |
| --- | --- | --- | --- | --- |
| Solder | 50 | 0.01 | 1.14 | 0.23 |
| Electrode terminal unit (upper part of conductive layer) | 300 | 0.05 | 0.95 | 0.19 |
| Wiring pattern (lower part of conductive layer) | 300 | 0.005 | 0.09 | 0.02 |
| Thermally conductive insulation layer | 5 | 0.25 | 125.74 | 25.15 |
| Metal base (aluminum) | 200 | 3 | 2.33 | 0.47 |
| Entire substrate (total) |  |  | 130.26 | 26.05 |

The layer thickness of the wiring pattern is 0.5 mm (500 μm) in Table 1, 0.05 mm (50 μm) in Table 2, and 0.005 mm (5 μm) in Table 3.

From Tables 1 to 3, it is ascertained that the heat resistance of any thermally conductive insulating layer takes most of the heat resistance of the entire substrate. In other words, it is ascertained that main factors of the heat resistance in the entire substrate is caused by the thermally conductive insulation film. Furthermore, it is also ascertained that the thickness of the wiring pattern influences the value of the heat resistance of the thermally conductive insulation layer.

Compared to the wiring pattern having a thickness of 0.005 mm (5 μm) illustrated in Table 3, in the wiring pattern which is ten times thicker and has a thickness of 0.05 mm (50 μm) illustrated in FIG. 2, as the heat spreads, it is ascertained that the heat resistance decreases by 23% when viewed from the entire substrate, and the temperature decreases by 6° C. or more. Furthermore, in the wiring pattern which is one hundred times thicker and has a thickness of 0.5 mm (500 μm) illustrated in Table 1, it is ascertained that the heat resistance decreases by 80% or more when viewed from the entire substrate, and the temperature decreases by 21° C.

Only by the simple estimation, it is possible to make it apparent that the thickness of the thickness (lower part of the conductive layer: first metal layer 5+second metal layer 7) of the wiring pattern is a dominant factor that determines the heat resistance of the thermally conductive insulation layer (ceramics layer 2).

Figure 18:
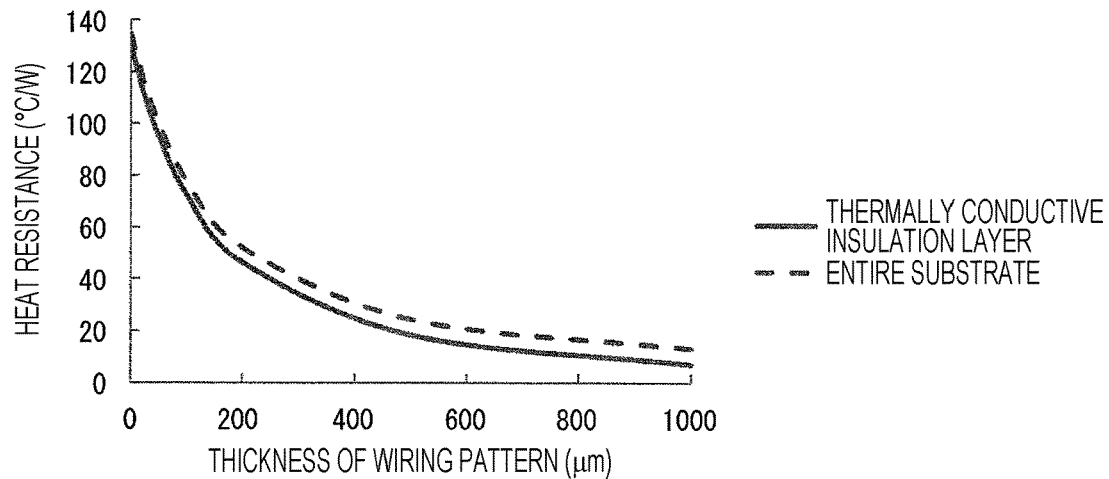
FIG. 18 is a graph illustrating a relationship between the thickness of a wiring pattern and the heat resistance.

Furthermore, based on the above-described condition of the estimation, further, a relationship of the thickness of the wiring pattern and the heat resistance of the thermally conductive insulation layer which is immediately below the wiring pattern is acquired in detail. FIG. 18 is a graph illustrating a relationship between the thickness of the wiring pattern which is acquired at this time and the heat resistance.

Figure 19:
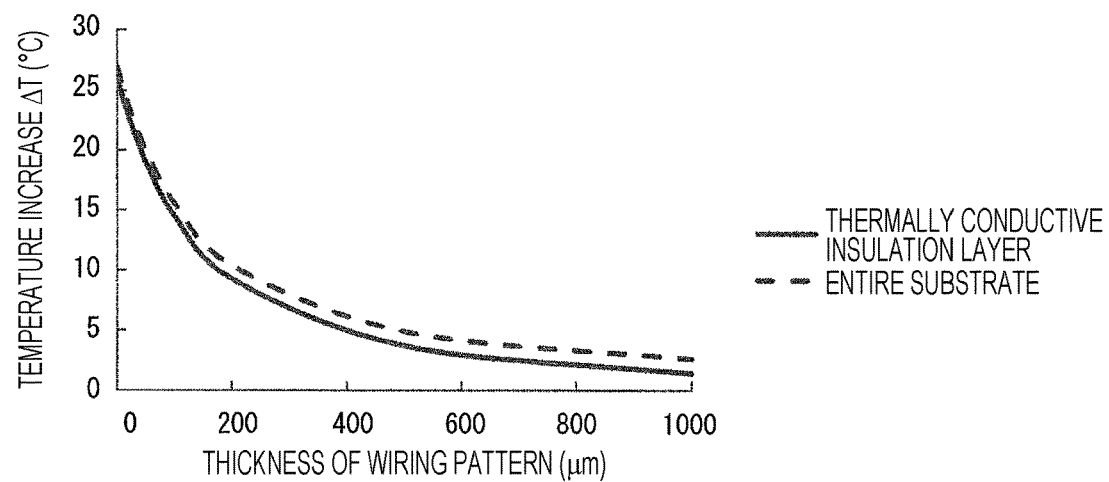
FIG. 19 is a graph illustrating a relationship between the thickness of the wiring pattern and the temperature.

In addition, the relationship about how much the temperature increase in the thermally conductive insulation layer by the heat emission of the light emitting element, is acquired in detail. FIG. 19 is a graph illustrating a relationship between the thickness of the wiring pattern acquired at this time and the temperature increase.

Above, in a case of considering the manufacturing costs when manufacturing the light emitting device, there is no instance where the thickness of the wiring pattern is 0.5 mm (500 μm) in reality, but when the thickness of the wiring pattern is at least 0.035 (35 μm) or 0.05 mm (50 μm) or more, and the thickness is more desirably 100 μm or more, an effect of improving the temperature by several ° C. or more than ten ° C. in some cases, is obtained. In the estimation here, from the graph illustrated in FIG. 19, when the thickness of the wiring pattern is 35 μm, a temperature decrease by approximately 5° C. is expected in the thermally conductive insulation layer compared to a case where the thickness is assumed to be 0 μm.

Therefore, in the wiring pattern, at a thin part (a part at which the first metal layer 5 and the second metal layer 7 overlap each other) at which the electrode terminal does not exist, it is ascertained that the above-described effect is achieved when the thickness is at least from 35 μm to 100 μm or more.

In addition, in the present invention, in order to achieve the above-described effect (effect of improving the temperature as the entire substrate), since the thickness of the wiring pattern is important, the first metal layer 5 and the second metal layer 7 which configure the wiring pattern may not be necessarily distinguished with a clear boundary.

[Conclusion]

A substrate for a light emitting device (hereinafter, referred to as a circuit board) according to Aspect 1 of the present invention is a circuit board 320 including: a metal base 1; a thermally conductive first electrical insulation layer (ceramics layer 2) formed on the metal base 1; and an electrode pattern 13 formed on the first electrical insulation layer (ceramics layer 2), in which the electrode pattern 13 includes a ground layer configured of a first metal layer 5 formed on the first electrical insulation layer (ceramics layer 2), a wiring unit configured of a second metal layer 7 formed on the ground layer, and an electrode terminal unit 10 formed on the wiring unit, and in which the thickness of a part at which the electrode terminal unit 10 is not formed in the electrode pattern 13 is at least equal to or greater than 35 μm.

Here, the thermal conductivity of the first electrical insulation layer formed on the metal base is an integer determined by a material, but the heat resistance can be arbitrarily changed to the thickness of the ground layer and the wiring unit which configure the electrode pattern formed on the first electrical insulation layer.

This depends on the following situation. The electrode pattern is formed of metal having high thermal conductivity, for example, copper. Therefore, even when the thickness of the ground layer and the wiring unit is, for example, thick, the heat resistance which is applied to the heat while the heat diffuses in the substrate vertical direction in the electrode pattern is extremely low, can be ignored compared to that in a case of passing through the first electrical insulation layer in the substrate vertical direction. While the heat diffuses in the substrate vertical direction, the heat also diffuses in the substrate horizontal direction.

Due to the same reason, the heat resistance applied to the heat that diffuses in the substrate horizontal direction can also be ignored.

In this manner, when the thickness of the ground layer and the wiring unit which configure the electrode pattern formed on the first electrical insulation layer becomes thick, while passing through the electrode pattern in the substrate vertical direction, it is possible to spread the heat in the substrate horizontal direction, and during this, there is no instance of being practically influenced by the heat resistance on the electrode pattern layer. As a result, without a case of being practically influenced by the heat resistance on the electrode pattern layer, a heat flux at this point of time when passing through the first electrical insulation layer in the substrate vertical direction decreases. When the heat flux decreases, the heat resistance decreases, for example, even when the thermal conductivity is the same, and thus, it is possible to decrease the heat resistance of the first electrical insulation layer. Here, the heat flux is defined by a heat quantity per unit time which passes through the section of a unit area, and the unit is an amount which is expressed by $W/m^2$ (square meter per watt).

On the contrary, when the thickness of the ground layer and the wiring unit is thin, while the heat passes through the electrode pattern in the substrate vertical direction, the heat diffusion in the substrate horizontal direction is not sufficient, and the heat flux at the point of time when passing through the first electrical insulation layer is maintained to be high. As a result, even when the thermal conductivity of the first electrical insulation layer is a value which is the same as that of the prior example, the heat resistance of the first electrical insulation layer increases.

In addition, in the circuit board including the metal base, the first electrical insulation layer, and the electrode pattern, since the size of the heat resistance of the entire circuit board depends on the heat resistance of the first electrical insulation layer, when the heat resistance of the first electrical insulation layer increases, the heat resistance of the entire circuit board also increases, and when the heat resistance of the first electrical insulation layer decreases, the heat resistance of the entire circuit board also decreases.

Therefore, in the above-described configuration, by setting the thickness of the part at which the electrode terminal unit is not formed in the electrode pattern, that is, the total thickness of the ground layer and the wiring unit, such that the heat resistance of the first electrical insulation layer becomes desirable heat resistance, it is possible to determine the heat resistance of the entire circuit board. In other words, the heat resistance of the entire circuit board can be changed according to the thickness of the part at which the electrode terminal unit is not formed in the electrode pattern. For example, when the thickness is thin, the heat resistance of the entire circuit board can be increased, and when the thickness is thick, the heat resistance of the entire circuit board can be decreased.

Accordingly, when the thickness of the part at which the electrode terminal unit is not formed in the electrode pattern is equal to or greater than a predetermined thickness, that is, when the thickness of the part is at least equal to or greater than 35 μm, it is possible to suppress the heat resistance of the entire circuit board to be low.

The circuit board related to Aspect 2 of the present invention, according to the above-described Aspect 1, it is preferable that the first metal layer 5 is a metal layer formed by an electroless plating method that uses a catalyst, and the second metal layer 7 is a metal layer that is formed by an electrolytic plating method and is thicker than the first metal layer 5.

The circuit board related to Aspect 3 of the present invention, according to the above-described Aspect 1, it is preferable that the first metal layer 5 is a metal layer formed by a method of injecting metal particles at a high speed, and the second metal layer 7 is a metal layer which is formed by the electrolytic plating method and is thicker than the first metal layer 5.

The circuit board related to Aspect 4 of the present invention, according to any one aspect of the above-described Aspects 1 to 3, it is preferable that a light reflective second electrical insulation layer (light reflection layer 11) which covers the electrode pattern 13 and the first electrical insulation layer (ceramics layer 2) to expose the electrode terminal unit 10 of the electrode pattern 13, is further provided, the first electrical insulation layer (ceramics layer 2) has thermal conduction properties that are equal to or higher than those of the second electrical insulation layer (light reflection layer 11), and the second electrical insulation layer (light reflection layer 11) has light reflection properties that are equal to or higher than those of the first electrical insulation layer (ceramics layer 2).

The circuit board related to Aspect 5 of the present invention, according to the above-described Aspect 4, it is preferable that the thickness of the second electrical insulation layer (light reflection layer 11) at a part that covers the electrode pattern is equal to or greater than 30 µm. In other words, it can be said that the thickness of the second electrical insulation layer (light reflection layer 11) formed at the upper part of the electrode pattern is preferably equal to or greater than 30 µm.

By the circuit board, a proportion by which the light generated from the light emitting element transmits the light reflective second electrical insulation layer can be reduced. In the aspect, the thickness of the second electrical insulation layer (light reflection layer 11) at the part which covers the electrode pattern 13 becomes equal to or greater than 30 µm. Therefore, even in a case of the electrode pattern 13 made of metal having relatively high light absorption ratio, such as copper, the proportion by which the light that transits the light reflective second electrical insulation layer and reaches the electrode pattern 13, can be reduced, and thus, it is possible to provide a circuit board that is the substrate for a light emitting device, which is appropriate for high-brightness illumination having higher reflectivity.

The circuit board related to Aspect 6 of the present invention, according to any one of the above-described Aspects 1 to 5, it is preferable that the thickness of the part at which the electrode terminal unit 10 is not formed in the electrode pattern 13 is the thickness within a range of 35 µm to 100 µm.

The circuit board related to Aspect 7 of the present invention, according to any one of the above-described Aspects 1 to 6, it is preferable that the wiring unit (second metal layer 7) is formed of copper or silver.

The circuit board related to Aspect 8 of the present invention, according to any one of the above-described Aspects 1 to 7, it is preferable that the wiring unit is configured in multiple layers, and a silver layer 8 is formed on the copper layer (second metal layer 7).

According to the configuration, a part of the silver layer exists between the electrode terminal unit and the copper layer.

The circuit board related to Aspect 9 of the present invention, according to any one of the above-described Aspects 1 to 8, it is preferable that the first electrical insulation layer (ceramics layer 2) is configured of a deposited layer of ceramics formed by a method of injecting the ceramics particles toward the base at a high speed.

The circuit board related to Aspect 10 of the present invention, according to the above-described Aspect 9, it is preferable that the first electrical insulation layer (ceramics layer 2) is configured of a deposited layer of ceramics formed by thermal spraying or an aerosol deposition method (AD method).

The circuit board related to Aspect 11 of the present invention, according to any one of the above-described Aspects 1 to 10, it is preferable that the first electrical insulation layer (ceramics layer 2) is made of alumina.

The circuit board related to Aspect 12 of the present invention, according to any one of the above-described Aspects 1 to 8, it is preferable that the first electrical insulation layer (ceramics layer 2) is made of a mixed layer of ceramics and glass.

The circuit board related to Aspect 13 of the present invention, according to any one of the above-described Aspects 4 to 12, it is preferable that the second electrical insulation layer (light reflection layer 11) is configured of a ceramics layer, a mixed layer of ceramics and glass, and a mixed layer of ceramics and a resin.

The circuit board related to Aspect 14 of the present invention, according to any one of the above-described Aspects 1 to 13, it is preferable that the metal base 1 is aluminum, an alloy containing aluminum, copper, or an alloy containing copper.

A light emitting device according to Aspect 15 of the present invention includes a light emitting element 12 which is electrically connected to the electrode terminal unit 10 in the circuit board according to any one of the above-described Aspects 1 to 14.

An illumination device according to Aspect 16 of the present invention includes a light emitting device 301 according to Aspect 15 as a light source.

A manufacturing method of the circuit board according to Aspect 17 of the present invention is a manufacturing method of the circuit board including the metal base 1, the method including: a process of forming a ceramics layer 2 on one surface of the metal base 1; a process of forming a first metal layer 5 that becomes a ground layer by precipitating metal on the ceramics layer by an electroless plating method by using a catalyst, on the ceramics layer 2; a process of forming a second metal layer 7 that becomes a wiring unit which is thicker than the first metal layer 5 by an electrolytic plating method in a mask opening unit by forming a mask layer (first mask 6) on the first metal layer 5; and a process of forming a desirable electrode pattern 13 by removing the first metal layer 5 covered with the mask layer by etching after removing the mask layer (first mask 6).

According to the configuration, since the first metal layer is formed by the electroless plating method by using the catalyst on the ceramics layer, it is possible to form the second metal layer by the electrolytic plating method on the first metal layer. Accordingly, it is possible to laminate the metal on the ceramics layer to be thick. In other words, on the ceramics layer, it is possible to form a thick metal layer (first metal layer+second metal layer).

In addition, since the second metal layer is formed by the electrolytic plating method, it is easy to adjust the thickness, and thus, it is possible to easily control the thickness of the metal layer formed on the ceramics layer.

Furthermore, by the above-described configuration, an effect similar to that of the circuit board according to above-described Aspect 1 is achieved.

A manufacturing method of a circuit board according to Aspect 18 of the present invention is a manufacturing method of the circuit board including the metal base 1, the method including: a process of forming a ceramics layer 2 on one surface of the metal base 1; a process of forming a first metal layer 5 that becomes a ground layer by precipitating metal on the ceramics layer 2 by an electroless plating method by using a catalyst, on the ceramics layer 2; a process of forming a second metal layer 7 that becomes a wiring unit which is thicker than the first metal layer 5 by an electrolytic plating method on the first metal layer 5; and a process of forming an electrode pattern 13 from the first metal layer 5 and the second metal layer 7 by etching a mask opening unit by forming a mask layer on the second metal layer.

According to the above-described configuration, since the first metal layer is formed by the electroless plating method by using the catalyst on the ceramics layer, it is possible to form the second metal layer by the electrolytic plating method on the first metal layer. Accordingly, it is possible to laminate the metal on the ceramics layer to be thick. In other words, on the ceramics layer, it is possible to form a thick metal layer (first metal layer+second metal layer).

In addition, since the second metal layer is formed by the electrolytic plating method, it is easy to adjust the thickness, and thus, it is possible to easily control the thickness of the metal layer formed on the ceramics layer.

Moreover, since the electrode pattern is formed by etching after forming the second metal layer, it is possible to form an electrode pattern (electrode pattern in which a boundary between the first metal layer and the second metal layer is not clear) in which the first metal layer and the second metal layer are integrated with each other.

The manufacturing method of the circuit board related to Aspect 19 of the present invention, according to the above-described Aspect 17 or 18, it is preferable that the process of forming the first metal layer 5 forms the first metal layer 5 which is made of copper and has a thickness that is equal to or less than 5 μm by precipitating the metal on the ceramics layer 2 by the electroless plating method by using the palladium catalyst as the catalyst, and the process of forming the second metal layer 7 forms the second metal layer 7 made of copper by the electrolytic plating method on the first metal layer 5 made of copper.

A manufacturing method of a circuit board according to Aspect 20 of the present invention is a manufacturing method of the circuit board including the metal base 1, the method including: a process of forming a ceramics layer 2 on one surface of the metal base 1; a process of forming a first metal layer 5 that becomes a ground layer by injecting metal particles at a high speed and depositing metal on the ceramics layer 2; a process of forming a second metal layer 7 that becomes a wiring unit which is thicker than the first metal layer 5 by an electrolytic plating method in a mask opening unit by forming a mask layer (first mask 6) on the first metal layer 5; and a process of forming a desirable electrode pattern 13 by removing the first metal layer 5 covered with the mask layer by etching after removing the mask layer (first mask 6).

According to the above-described configuration, it is possible to laminate the metal on the ceramics layer to be thick. In other words, on the ceramics layer, it is possible to form a thick metal layer (first metal layer+second metal layer).

In addition, since the second metal layer is formed by the electrolytic plating method, it is easy to adjust the thickness, and thus, it is possible to easily control the thickness of the metal layer formed on the ceramics layer.

A manufacturing method of a circuit board according to Aspect 21 of the present invention is a manufacturing method of the circuit board including the metal base 1, the method including: a process of forming a ceramics layer 2 on one surface of the metal base 1; a process of forming a first metal layer 5 that becomes a ground layer by injecting metal particles at a high speed and depositing metal on the ceramics layer 2; a process of forming a second metal layer 7 that becomes a wiring unit which is thicker than the first metal layer 5 by an electrolytic plating method on the first metal layer 5; and a process of forming an electrode pattern 13 from the first metal layer 5 and the second metal layer 7 by etching a mask opening unit by forming a mask layer on the second metal layer.

According to the above-described configuration, it is possible to laminate the metal on the ceramics layer to be thick. In other words, on the ceramics layer, it is possible to form a thick metal layer (first metal layer+second metal layer).

In addition, since the second metal layer is formed by the electrolytic plating method, it is easy to adjust the thickness, and thus, it is possible to easily control the thickness of the metal layer formed on the ceramics layer.

Moreover, since the electrode pattern is formed by etching after forming the second metal layer, it is possible to form an electrode pattern (electrode pattern in which a boundary between the first metal layer and the second metal layer is not clear) in which the first metal layer and the second metal layer are integrated with each other.

The manufacturing method of the circuit board related to Aspect 22 of the present invention, according to the above-described Aspect 20 or 21, it is preferable that, in the process of forming the first metal layer 5, as a method of injecting the metal particles at a high speed and depositing the metal, the thermal spraying or the aerosol deposition method (AD method) is used.

The manufacturing method of the circuit board related to Aspect 23 of the present invention, according to any one of the above-described Aspects 20 to 22, it is preferable that the process of forming the first metal layer 5 forms the first metal layer 5 which is made of copper and has a thickness of 2 μm to 40 μm by injecting the copper particles at a high speed and depositing the copper on the ceramics layer 2, and the process of forming the second metal layer 7 forms the second metal layer 7 made of copper by the electrolytic plating method on the first metal layer 5 made of copper.

The manufacturing method of the circuit board related to Aspect 24 of the present invention, according to any one of the above-described Aspect 17 or 20, it is preferable that the process of forming the electrode pattern 13 forms the electrode terminal unit 10 made of copper in the mask opening unit which is formed separately by forming still another mask layer on the layer of silver (silver layer 8) after forming the layer of silver (silver layer 8) through the mask opening unit on the surface of the second metal layer 7 before removing the mask layer.

A manufacturing method of a circuit board according to Aspect 25 of the present invention is a manufacturing method of the circuit board 320 including a base (metal base 1) made of aluminum, the metal base 1 is a metal base made of aluminum, a process of forming a protective layer 3 on one surface of the metal base 1 is further provided between a process of forming a ceramics layer 2 on the other surface of the metal base 1 and a process of forming a first metal layer on the ceramics layer, and the process of forming the protective layer 3 forms the protective layer 3 in which pores formed in a porous shape on an alumite layer are blocked by performing sealing treatment after covering the metal base 1 other than a part covered with the ceramics layer 2 with an anodic oxidized film made of alumite by anodic oxidation treatment.

The manufacturing method of the circuit board related to Aspect 26 of the present invention, according to the Aspect 25, it is preferable that the sealing treatment is performed by filling up a through pore made on the ceramics layer 2 with an insulation material before the process of forming the protective layer 3.

The manufacturing method of the circuit board related to Aspect 27 of the present invention, according to the Aspect 26, it is preferable that a resin, glass, or fine ceramics particles which use a resin or glass as a binder, is used as the insulation material which fills up the through pore.

The present invention is not limited to each of the above-described embodiments, various changes are possible within the range illustrated in claims, and an embodiment obtained by appropriately combining technical means disclosed in each of the different embodiments is also included in the technical range of the present invention. Furthermore, by combining the technical means disclosed in each of the embodiments, it is possible to form new technical characteristics.

INDUSTRIAL APPLICABILITY

The present invention can be appropriately used in a circuit board used in a high-brightness light emitting device.

REFERENCE SIGNS LIST

1 METAL BASE
2 CERAMICS LAYER (FIRST ELECTRICAL INSULATION LAYER)
3 PROTECTIVE LAYER
4 CATALYST LAYER
5 FIRST METAL LAYER
6 FIRST MASK
6A FIRST MASK
7 SECOND METAL LAYER (WIRING UNIT)
8 SILVER LAYER (WIRING UNIT)
9 SECOND MASK
9A SECOND MASK
10 ELECTRODE TERMINAL UNIT
11 LIGHT REFLECTION LAYER (SECOND ELECTRICAL INSULATION LAYER)
12 LIGHT EMITTING ELEMENT
13 ELECTRODE PATTERN
15 FLAT LAYER
101 ILLUMINATION DEVICE
102 HEAT SINK
103 REFLECTOR
301 LIGHT EMITTING DEVICE
302 METAL BASE
303 ELECTRODE PATTERN
304 LIGHT EMITTING ELEMENT
305 LIGHT REFLECTION RESIN FRAME
306 SEALING RESIN CONTAINING PHOSPHOR
307 ANODE ELECTRODE
308 CATHODE ELECTRODE
309 ANODE MARK
310 CATHODE MARK
311 INTERMEDIATE LAYER
312 REFLECTION LAYER
320 CIRCUIT BOARD
320A CIRCUIT BOARD
320B CIRCUIT BOARD
320C CIRCUIT BOARD

The invention claimed is:

1. A substrate for a light emitting device comprising: a metal base; a thermally conductive first electrical insulation layer formed on the metal base; an electrode pattern formed on the first electrical insulation layer; and a light reflective second electrical insulation layer which covers the electrode pattern and the first electrical insulation layer, wherein the electrode pattern includes a ground layer configured of a first metal layer formed on the first electrical insulation layer, a wiring unit configured of a second metal layer formed on the ground layer, and an electrode terminal unit formed on the wiring unit, wherein the second metal layer is formed between the first metal layer and the electrode terminal unit, wherein the thickness of a part at which the electrode terminal unit is not formed in the electrode pattern is at least equal to or greater than 35 μm, wherein the light reflective second electrical insulation layer is provided so as to expose the electrode terminal unit of the electrode pattern, wherein the first electrical insulation layer has thermal conduction properties that are equal to or higher than those of the second electrical insulation layer, wherein the second electrical insulation layer has light reflection properties that are equal to or higher than those of the first electrical insulation layer, wherein the first metal layer is a metal layer formed by an electroless plating method that uses a catalyst, and wherein the second metal layer is a metal layer formed by an electrolytic plating method and is thicker than the first metal layer.

2. The substrate for a light emitting device according to claim 1, wherein the thickness of the second electrical insulation layer at a part that covers the electrode pattern is equal to or greater than 30 μm.

3. The substrate for a light emitting device according to claim 1, wherein the thickness of the part at which the electrode terminal unit is not formed in the electrode pattern is in a range of 35 μm to 100 μm.

4. The substrate for a light emitting device according to claim 1, wherein the second metal layer is formed of copper or silver.

5. The substrate for a light emitting device according to claim 1, wherein the wiring unit is configured in multiple layers, and a silver layer is formed on a copper layer.

6. The substrate for a light emitting device according to claim 1, wherein the first electrical insulation layer is configured of a deposited layer of ceramics formed by a method of injecting ceramics particles toward the metal base at a high speed.

7. The substrate for a light emitting device according to claim 1, wherein the first electrical insulation layer is configured of a deposited layer of ceramics formed by thermal spraying or an aerosol deposition method (AD method).

8. The substrate for a light emitting device according to claim 1, wherein the first electrical insulation layer is made of alumina.

9. The substrate for a light emitting device according to claim 1, wherein the first electrical insulation layer made of a mixed layer of ceramics and glass.

10. The substrate for a light emitting device according to claim 1, wherein the second electrical insulation layer is configured of a ceramics layer, a mixed layer of ceramics and glass, or a mixed layer of ceramics and a resin.

11. The substrate for a light emitting device according to claim 1, wherein the metal base is aluminum, an alloy containing aluminum, copper, or an alloy containing copper.

12. The substrate for a light emitting device according to claim 1, wherein an alumite layer is formed on one side of the metal base, the side being opposite to another side of the metal base on which another side the first electrical insulation layer is formed.

13. The substrate for a light emitting device according to claim 1, wherein a flat layer is formed between the first electrical insulation layer and the first metal layer.

14. A substrate for a light emitting device comprising: a metal base; a thermally conductive first electrical insulation layer formed on the metal base; an electrode pattern formed on the first electrical insulation layer; and a light reflective second electrical insulation layer which covers the electrode pattern and the first electrical insulation layer, wherein the electrode pattern includes a ground layer configured of a first metal layer formed on the first electrical insulation layer, a wiring unit configured of a second metal layer formed on the ground layer, and an electrode terminal unit formed on the wiring unit, wherein the second metal layer is formed between the first metal layer and the electrode terminal unit, wherein the thickness of a part at which the electrode terminal unit is not formed in the electrode pattern is at least equal to or greater than 35 µm, wherein the light reflective second electrical insulation layer is provided so as to expose the electrode terminal unit of the electrode pattern, wherein the first electrical insulation layer has thermal conduction properties that are equal or higher than those of the second electrical insulation layer, wherein the second electrical insulation layer has light reflection properties that are equal to or higher than those of the first electrical insulation layer, wherein the first metal layer is a metal layer formed by a method of injecting metal particles at a high speed, and wherein the second metal layer is a metal layer which is formed by the electrolytic plating method and is thicker than the first metal layer.

15. The substrate for a light emitting device according to claim 14, wherein the thickness of the second electrical insulation layer at a part that covers the electrode pattern is equal to or greater than 30 µm.

16. The substrate for a light emitting device according to claim 14, wherein the thickness of the part at which the electrode terminal unit is not formed in the electrode pattern is in a range of 35 µm to 100 µm.

17. The substrate for a light emitting device according to claim 14, wherein the second metal layer is formed of copper or silver.

18. The substrate for a light emitting device according to claim 14, wherein the wiring unit is configured in multiple layers, and a silver layer is formed on a copper layer.

19. The substrate for a light emitting device according to claim 14, wherein the first electrical insulation layer is configured of a deposited layer of ceramics formed by a method of injecting ceramics particles toward the metal base at a high speed.

20. The substrate for a light emitting device according to claim 14, wherein the first electrical insulation layer is configured of a deposited layer of ceramics formed by thermal spraying or an aerosol deposition method (AD method).

21. The substrate for a light emitting device according to claim 14, wherein the first electrical insulation layer is made of alumina.

22. The substrate for a light emitting device according to claim 14, wherein the first electrical insulation layer made of a mixed layer of ceramics and glass.

23. The substrate for a light emitting device according to claim 14, wherein the second electrical insulation layer is configured of a ceramics layer, a mixed layer of ceramics and glass, or a mixed layer of ceramics and a resin.

24. The substrate for a light emitting device according to claim 14, wherein the metal base is aluminum, an alloy containing aluminum, copper, or an alloy containing copper.

25. The substrate for a light emitting device according to claim 14, wherein an alumite layer is formed on one side of the metal base, the side being opposite to another side of the metal base on which another side the first electrical insulation layer is formed.

26. The substrate for a light emitting device according to claim 14, wherein a flat layer is formed between the first electrical insulation layer and the first metal layer.

27. A light emitting device comprising a light emitting element which is electrically connected to an electrode terminal unit of a substrate for a light emitting device, the substrate including: a metal base; a thermally conductive first electrical insulation layer formed on the metal base; an electrode pattern formed on the first electrical insulation layer; and, a light reflective second electrical insulation layer which covers the electrode pattern and the first electrical insulation layer, wherein the electrode pattern includes a ground layer configured of a first metal layer formed on the first electrical insulation layer, a wiring unit configured of a second metal layer formed on the ground layer, and the electrode terminal unit formed on the wiring unit, wherein the second metal layer is formed between the first metal layer and the electrode terminal unit, wherein the thickness of a part at which the electrode terminal unit is not formed in the electrode pattern is at least equal to or greater than 35 µm, wherein the light reflective second electrical insulation layer is provided so as to expose the electrode terminal unit of the electrode pattern, wherein the first electrical insulation layer has thermal conduction properties that are equal to or higher than those of the second electrical insulation layer, wherein the second electrical insulation layer has light reflection properties that are equal to or higher than those of the first electrical insulation layer, wherein the first metal layer is a metal layer formed by an electroless plating method that uses a catalyst, and wherein the second metal layer is a metal layer formed by an electrolytic plating method and is thicker than the first metal layer.

28. An illumination device comprising, as a light source, a light emitting device comprising a light emitting element which is electrically connected to an electrode terminal unit of a substrate for a light emitting device, the substrate including: a metal base; a thermally conductive first electrical insulation layer formed on the metal base; an electrode pattern formed on the first electrical insulation layer; and, a light reflective second electrical insulation layer which covers the electrode pattern and the first electrical insulation layer, wherein the electrode pattern includes a ground layer configured of a first metal layer formed on the first electrical insulation layer, a wiring unit configured of a second metal layer formed on the ground layer, and the electrode terminal unit formed on the wiring unit, wherein the second metal layer is formed between the first metal layer and the electrode terminal unit, wherein the thickness of a part at which the electrode terminal unit is not formed in the electrode pattern is at least equal to or greater than 35 µm, wherein the light reflective second electrical insulation layer is provided so as to expose the electrode terminal unit of the electrode pattern, wherein the first electrical insulation layer has thermal conduction properties that are equal to or higher than those of the second electrical insulation layer, wherein the second electrical insulation layer has light reflection properties that are equal to or higher than those of the first electrical insulation layer, wherein the first metal layer is a metal layer formed by an electroless plating method that uses a catalyst, and wherein the second metal layer is a metal layer formed by an electrolytic plating method and is thicker than the first metal layer.

29. A light emitting device comprising a light emitting element which is electrically connected to an electrode terminal unit of a substrate for a light emitting device, the substrate including: a metal base; a thermally conductive first electrical insulation layer formed on the metal base; an electrode pattern formed on the first electrical insulation layer; and, a light reflective second electrical insulation layer which covers the electrode pattern and the first electrical insulation layer, wherein the electrode pattern includes a ground layer configured of a first metal layer formed on the first electrical insulation layer, a wiring unit configured of a second metal layer formed on the ground layer, and the electrode terminal unit formed on the wiring unit, wherein the second metal layer is formed between the first metal layer and the electrode terminal unit, wherein the thickness of a part at which the electrode terminal unit is not formed in the electrode pattern is at least equal to or greater than 35 μm, wherein the light reflective second electrical insulation layer is provided so as to expose the electrode terminal unit of the electrode pattern, wherein the first electrical insulation layer has thermal conduction properties that are equal to or higher than those of the second electrical insulation layer, wherein the second electrical insulation layer has light reflection properties that are equal to or higher than those of the first electrical insulation layer, wherein the first metal layer is a metal layer formed by a method of injecting metal particles at a high speed, and wherein the second metal layer is a metal layer which is formed by the electrolytic plating method and is thicker than the first metal layer.

30. An illumination device comprising, as a light source, a light emitting device comprising a light emitting element which is electrically connected to an electrode terminal unit of a substrate for a light emitting device, the substrate including: a metal base; a thermally conductive first electrical insulation layer formed on the metal base; an electrode pattern formed on the first electrical insulation layer; and, a light reflective second electrical insulation layer which covers the electrode pattern and the first electrical insulation layer, wherein the electrode pattern includes a ground layer configured of a first metal layer formed on the first electrical insulation layer, a wiring unit configured of a second metal layer formed on the ground layer, and the electrode terminal unit formed on the wiring unit, wherein the second metal layer is formed between the first metal layer and the electrode terminal unit, wherein the thickness of a part at which the electrode terminal unit is not formed in the electrode pattern is at least equal to or greater than 35 μm, wherein the light reflective second electrical insulation layer is provided so as to expose the electrode terminal unit of the electrode pattern, wherein the first electrical insulation layer has thermal conduction properties that are equal to or higher than those of the second electrical insulation layer, wherein the second electrical insulation layer has light reflection properties that are equal to or higher than those of the first electrical insulation layer, wherein the first metal layer is a metal layer formed by a method of injecting metal particles at a high speed, and wherein the second metal layer is a metal layer which is formed by the electrolytic plating method and is thicker than the first metal layer.

\* \* \* \* \*